United States Patent [19]
Ishii

[11] Patent Number: 5,529,657
[45] Date of Patent: Jun. 25, 1996

[54] PLASMA PROCESSING APPARATUS

[75] Inventor: Nobuo Ishii, Yamanashi-ken, Japan

[73] Assignee: Tokyo Electron Limited, Tokyo, Japan

[21] Appl. No.: 317,490

[22] Filed: Oct. 4, 1994

[30] Foreign Application Priority Data

| Oct. 4, 1993 | [JP] | Japan | 5-273138 |
| Oct. 4, 1993 | [JP] | Japan | 5-273139 |
| Oct. 4, 1993 | [JP] | Japan | 5-273140 |
| Oct. 20, 1993 | [JP] | Japan | 5-284207 |
| Oct. 20, 1993 | [JP] | Japan | 5-284211 |

[51] Int. Cl.$^6$ ............................................. H05H 1/00
[52] U.S. Cl. .................. 156/345; 118/723 I; 118/723 E; 216/68
[58] Field of Search ................................ 156/345, 643.1; 118/723 I, 724, 723 E; 204/298.31, 298.34, 298.09, 298.15, 298.06, 298.01, 298.02; 315/111.21; 216/67, 68

[56] References Cited

U.S. PATENT DOCUMENTS

| 4,771,730 | 9/1988 | Tezuka | 156/345 X |
| 4,948,458 | 8/1990 | Ogle | 156/643 |
| 5,246,532 | 9/1993 | Ishida | 156/345 |
| 5,261,962 | 11/1993 | Hamamoto et al. | 118/723 I |
| 5,275,683 | 1/1994 | Arami et al. | 156/345 |
| 5,298,465 | 3/1994 | Levy | 437/228 X |
| 5,304,279 | 4/1994 | Coultas et al. | 156/345 |
| 5,320,982 | 6/1994 | Tsubone et al. | 118/724 X |
| 5,354,417 | 10/1994 | Cheung et al. | 156/643 |
| 5,376,213 | 12/1994 | Ueda et al. | 118/723 E |

FOREIGN PATENT DOCUMENTS

| 0379828 | 1/1990 | European Pat. Off. | |
| 61-119686 | 6/1986 | Japan | |
| 3-79025 | 4/1991 | Japan | |
| 333228 | 11/1992 | Japan | 156/345 |
| 259122 | 10/1993 | Japan | 156/345 |

*Primary Examiner*—Thi Dang
*Attorney, Agent, or Firm*—Oblon, Spivak, McClelland, Maier & Neustadt

[57] ABSTRACT

A plasma processing apparatus includes a chamber provided with a susceptor therein for supporting a wafer. A flat coil antenna is mounted on an outer surface of an insulating wall of the chamber to face the wafer. An RF current is supplied to the coil, thereby generating a plasma in the chamber between the coil and the wafer. A focus ring is provided on the susceptor to surround the wafer, which has a projecting portion projecting toward the coil past the surface of the wafer, and consists of an electrical insulator or a high resistor, for directing the plasma generated between the projecting portion and the coil in a direction substantially parallel to the surface of the wafer.

15 Claims, 22 Drawing Sheets

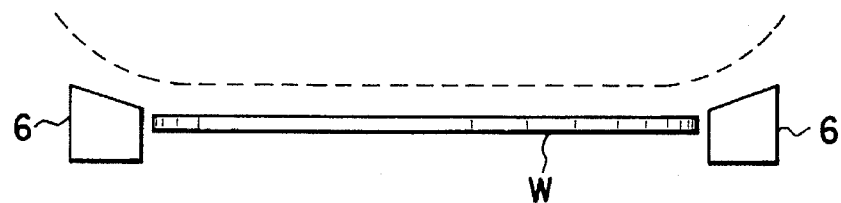
FIG. 6
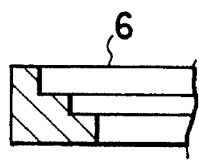 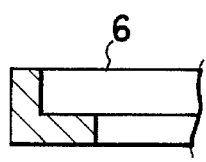 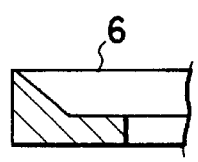
FIG. 7A    FIG. 7B    FIG. 7C
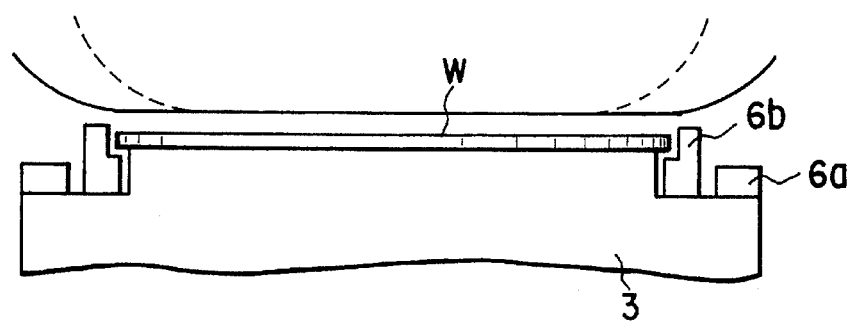
FIG. 8
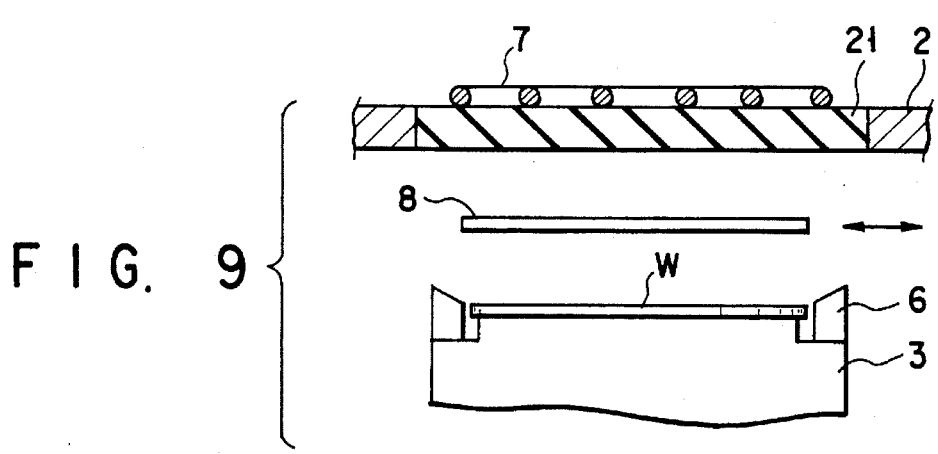
FIG. 9

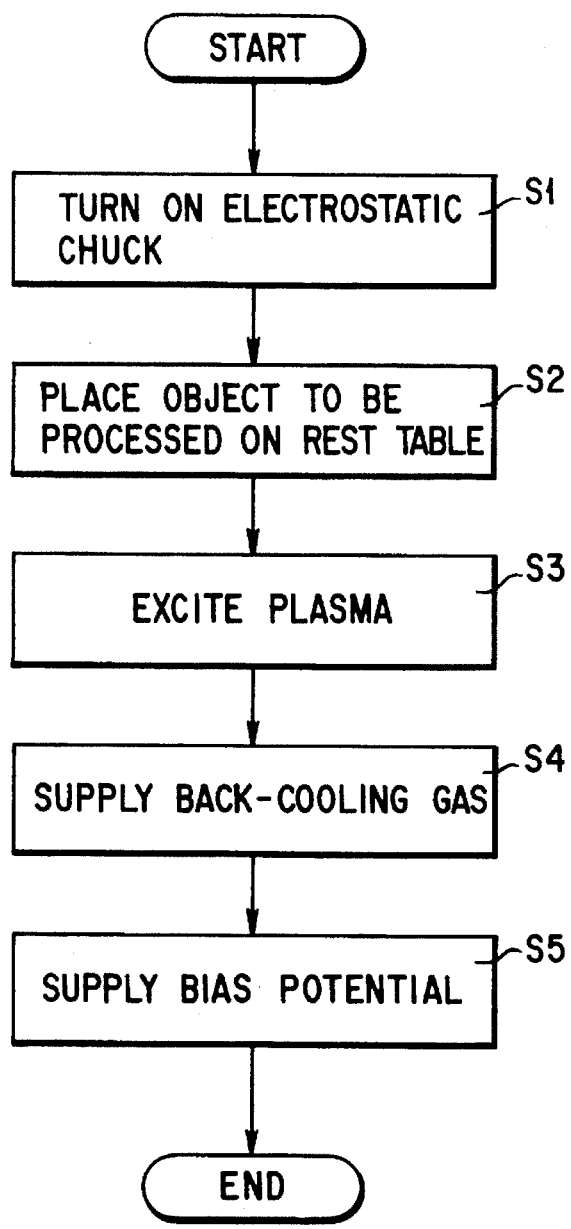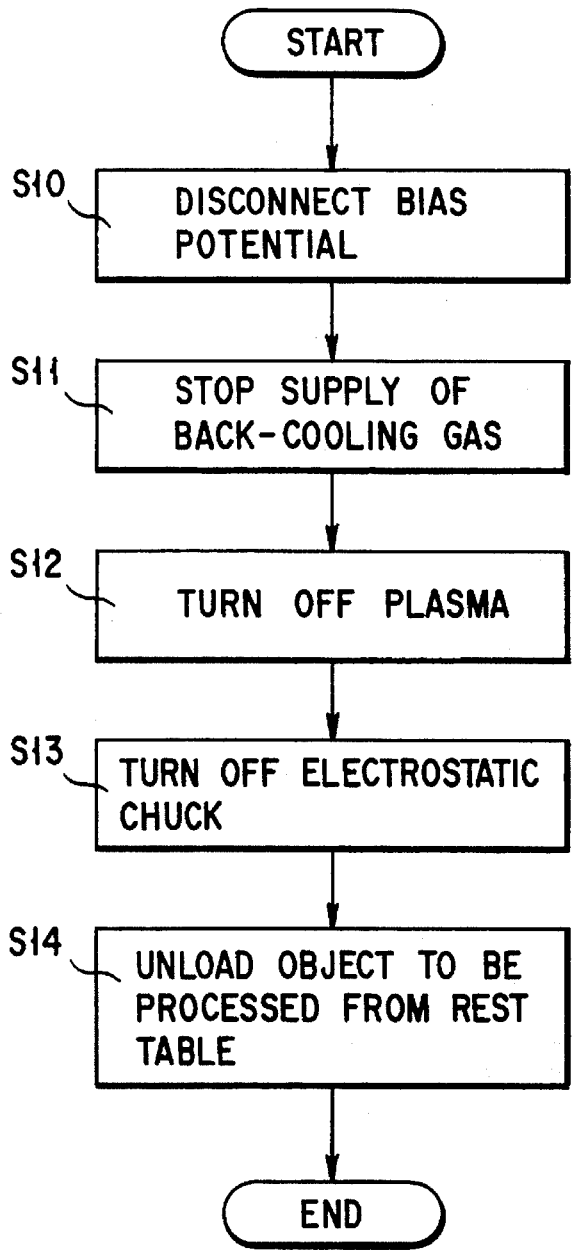
FIG. 12A
FIG. 12B

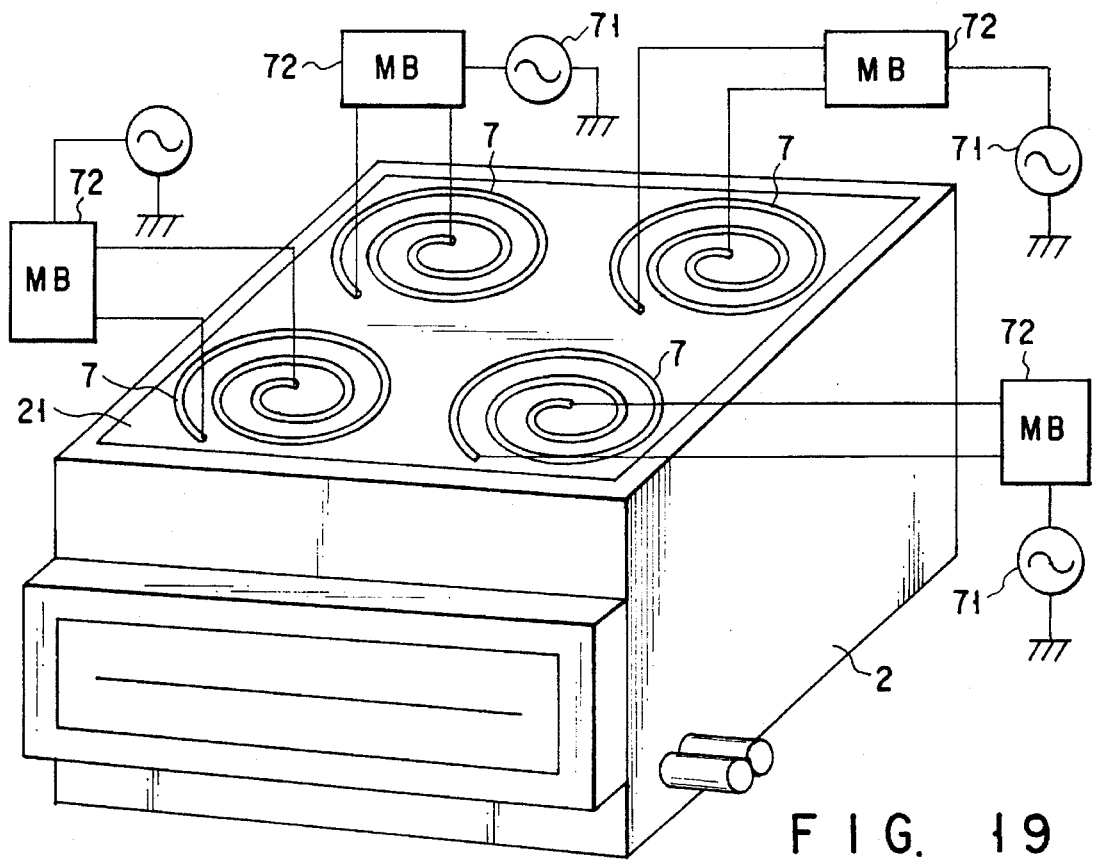
F I G. 19
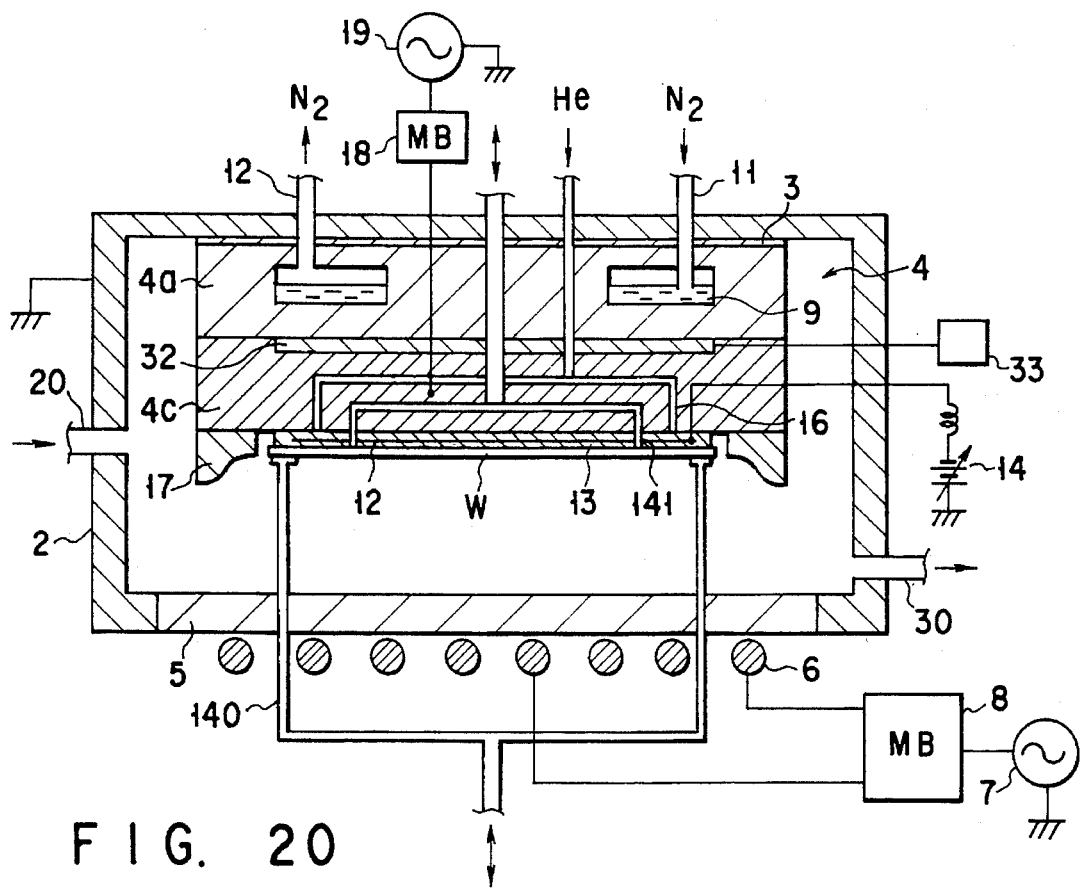
F I G. 20

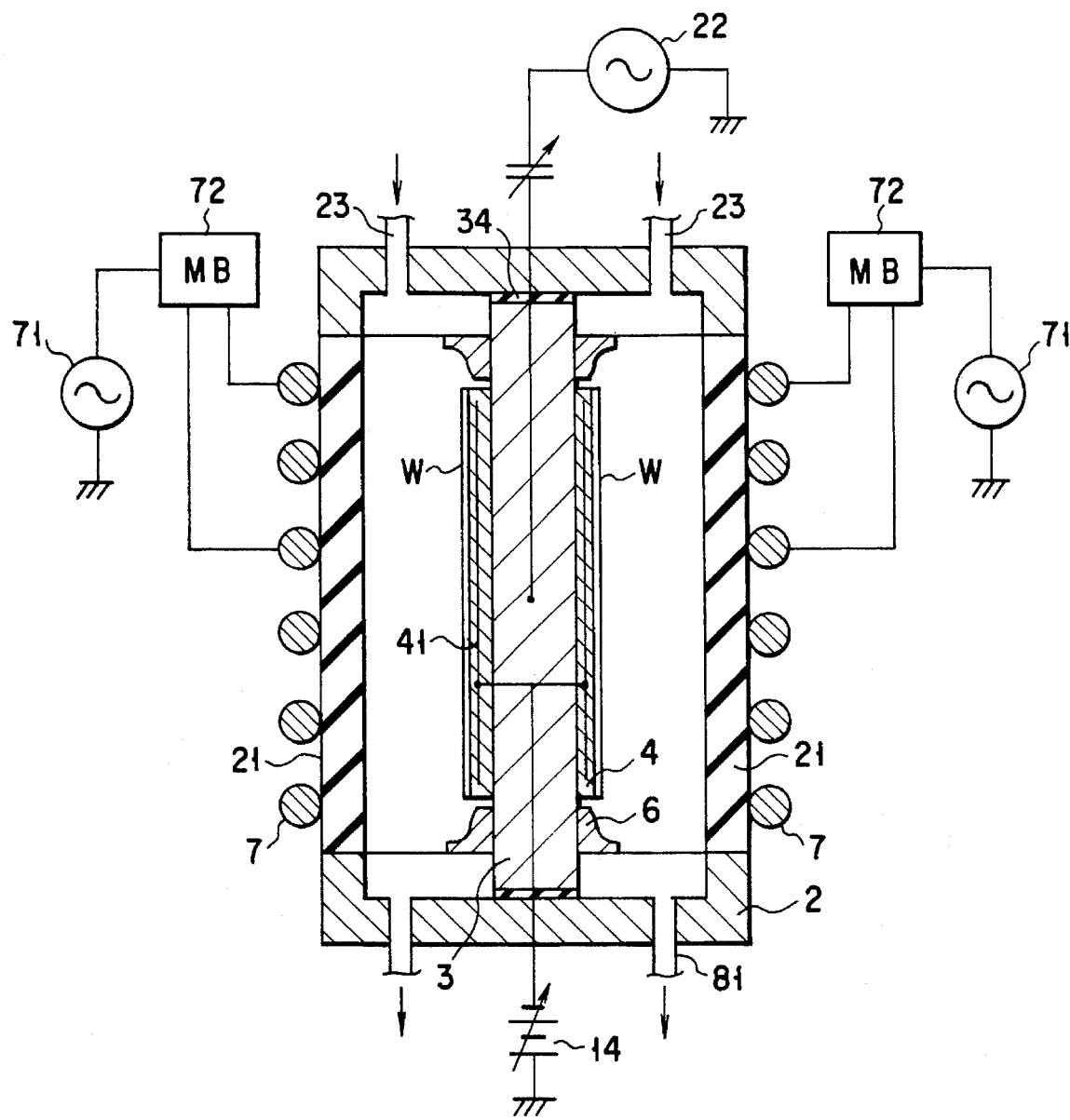
F I G. 21

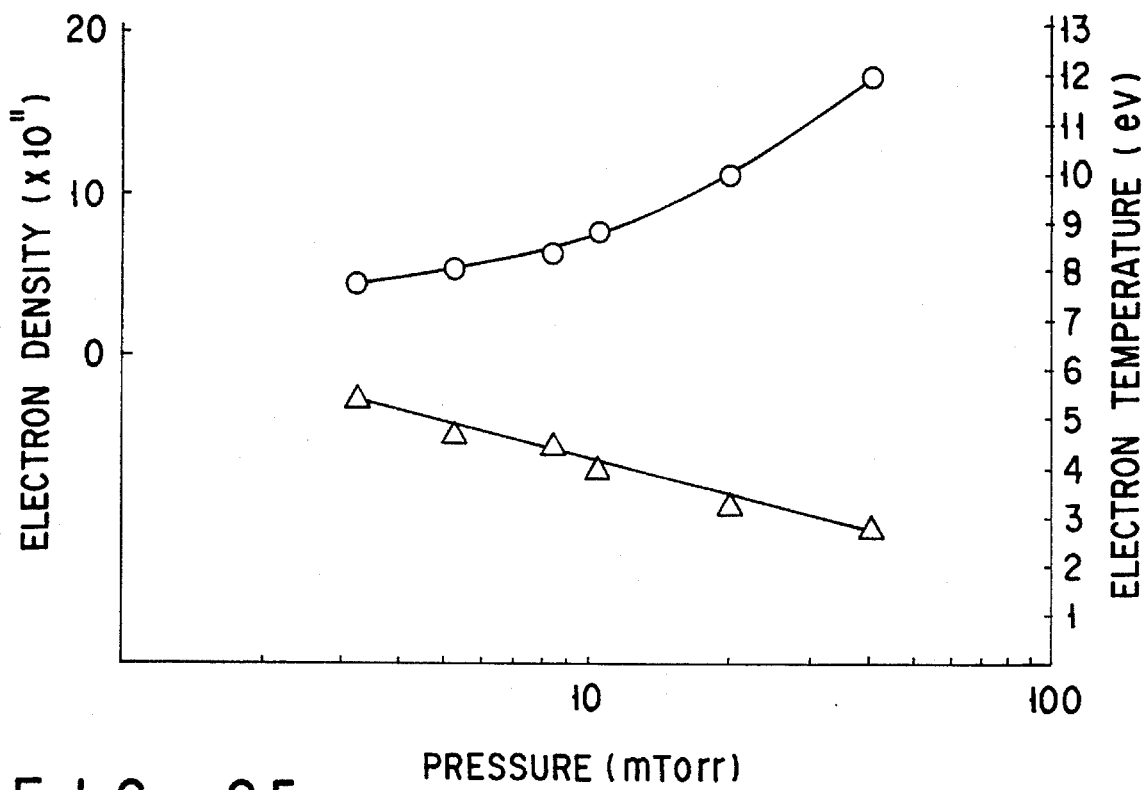
F I G. 25
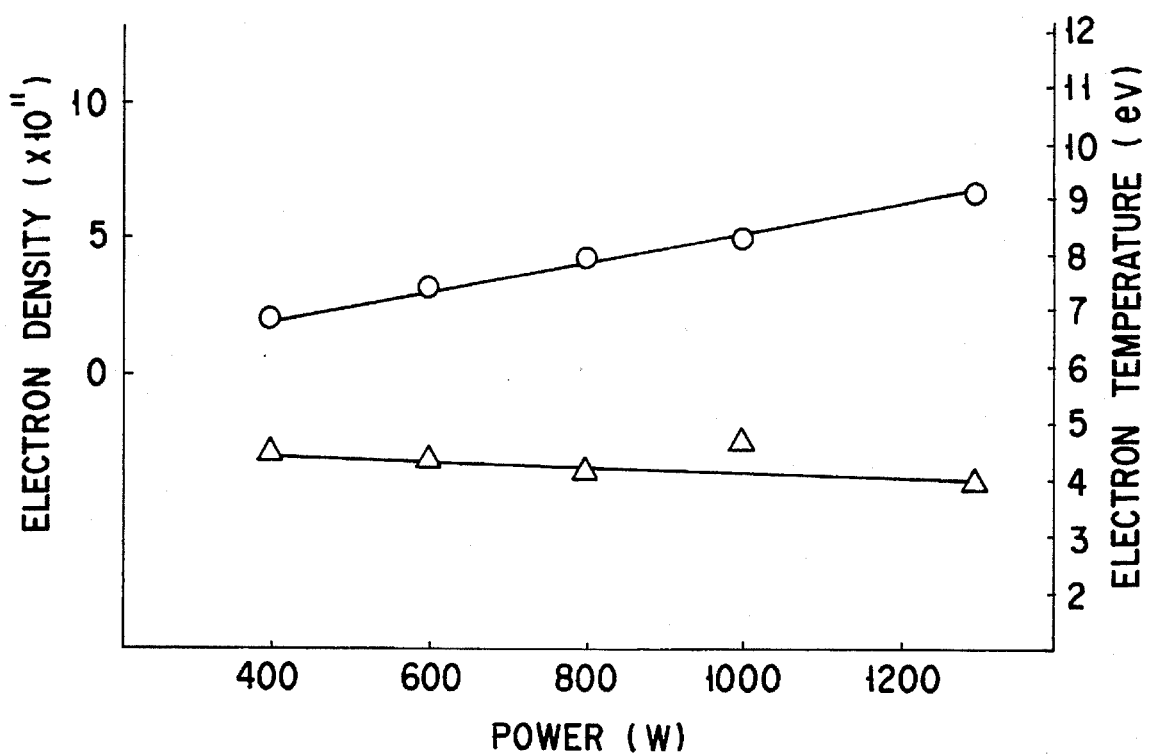
F I G. 26

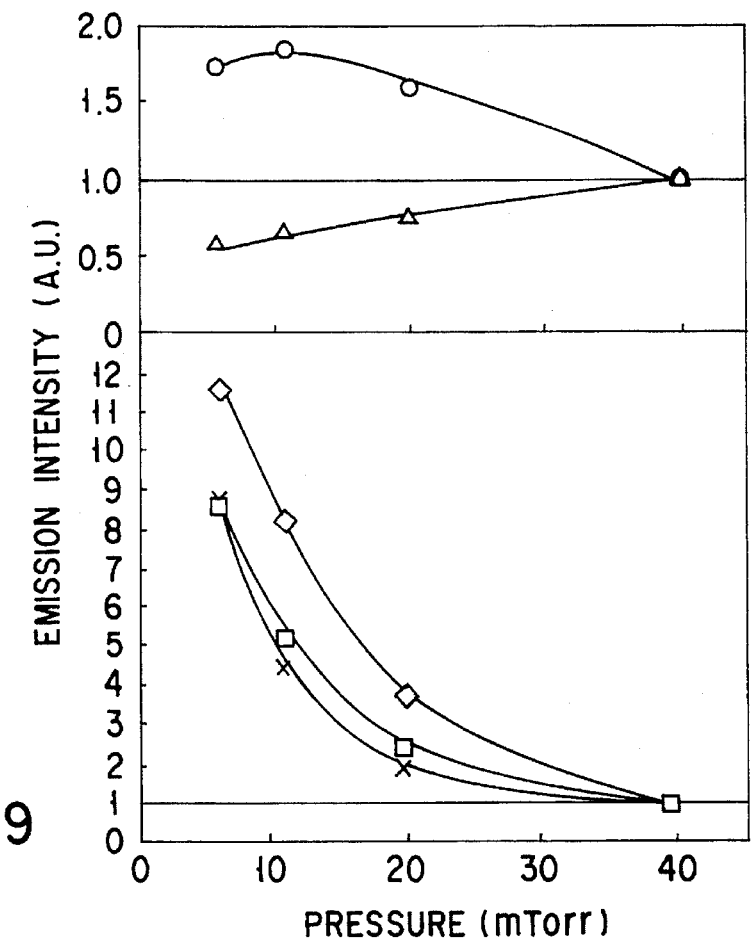
F I G. 29
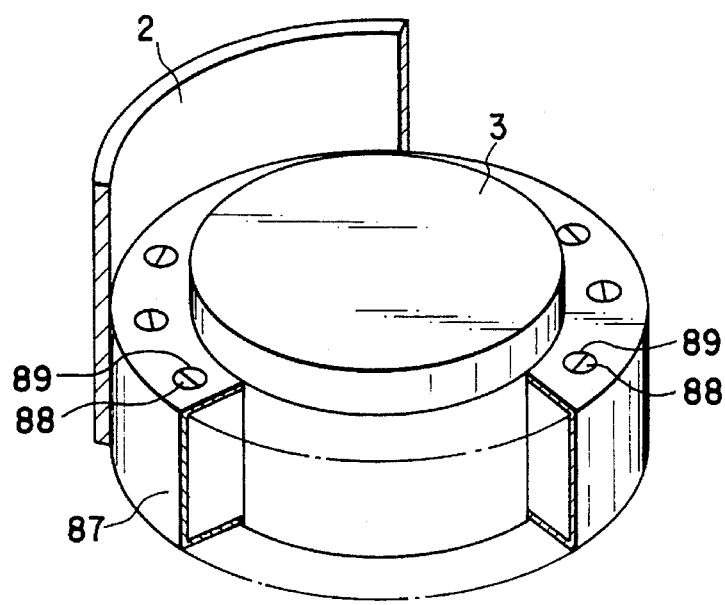
F I G. 30

PLASMA PROCESSING APPARATUS

BACKGROUND OF THE INVENTION

1. Field of the Invention

The present invention relates to a plasma processing apparatus employing the RF induction technique.

2. Description of the Related Art

In semiconductor wafer processing steps, dry etching is performed for, e.g., isolation of capacitors and elements and formation of contact holes. A parallel plate type plasma processing apparatus is known as a representative of conventional apparatuses that perform dry etching, as described in Jpn. Pat. Appln KOKAI Publication No. 61-119686.

In this processing apparatus, a rest table or susceptor serving also as a lower electrode is disposed in an air-tight chamber, and an upper electrode serving also as a gas supply section is disposed above the rest table to oppose it.

In this plasma processing apparatus, first, a semiconductor wafer as an object to be processed is placed on the rest table, and a process gas is supplied from the gas supply section into the chamber. Simultaneously, an RF power is applied across the two electrodes by an RF power supply in order to generate a plasma between these electrodes, thereby etching the wafer by reactive ions in the plasma.

Recently, the line width of patterns of a semiconductor device is more and more decreasing. When a plasma is generated in the above apparatus, the pressure in the chamber is 100 mTorr to 1 Torr. Under this high pressure, since the mean free time of ions is short, micropatterning is difficult to perform. Also, although the diameters of wafers are increasing, when the mean free time of ions is short, a high uniformity of the plasma distribution over a wide surface cannot be ensured, and thus it is difficult to uniformly process a wafer having a large diameter.

For this reason, recently, employment of the RF induction method has been studied. According to this method, as described in European Pat. Appln KOKAI Publication No. 379828 and Jpn. Pat. Appln KOKAI Publication No. 3-79025, the upper wall of the chamber opposing the rest table is constituted by an insulating member, e.g., a quartz glass member, and a flat coil is mounted on the outer surface of the insulating member. An RF current is supplied to this coil to form an electromagnetic field in the chamber. The electrons flowing in the electromagnetic field are caused to collide against neutral particles in the process gas, thereby generating a plasma.

According to this method, a substantially concentric electric field is induced in accordance with the shape of the coil, thereby providing a plasma confining effect. When compared to the conventional parallel plate type plasma processing apparatus, the plasma can be generated with a comparatively low pressure. Accordingly, the mean free time of ions in the generated plasma is long. Therefore, etching by means of this plasma is suitable for micropatterning. The plasma is diffused from a high-density area to a low-density area. Since the mean free time of ions is long, the plasma density distribution is smooth. Thus, the uniformity of the plasma on a plane parallel to the flat surface of the wafer is high, thereby increasing the uniformity within a plane of plasma processing for a wafer having a large diameter.

In this manner, the RF induction method attracts attention as a method suitable for micropatterning and processing of wafers with large diameters. However, this method still has many factors that are yet unknown. Studies are required as to, e.g., how to generate a plasma having a higher density without much increasing the RF power. As a way of generating a high-density plasma, an insulator may be arranged around the wafer, thereby concentrating the plasma. In this case, studies are required as to how to adjust the degree of concentration of the plasma and how to ensure the flatness of the lower surface of the plasma at the peripheral portion of the wafer. The above RF induction method can be realized only after these points are sufficiently studied.

SUMMARY OF THE INVENTION

It is an object of the present invention to provide a plasma processing apparatus which, when processing an object to be processed with a plasma obtained by applying an RF power to an antenna made of a coil, can concentrate the plasma and can obtain a high flatness in the lower surface of the plasma.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a diagram for explaining the shape of a plasma;

FIGS. 7A to 7C are sectional views showing other arrangements of the focus ring;

FIG. 8 is a sectional view showing the main part of another arrangement of the present invention;

FIG. 9 is a diagram showing an arrangement employed for preventing an object to be processed from being damaged by an electric field;

FIG. 12A is a flow chart for explaining steps before start of etching;

FIG. 12B is a flow chart for explaining steps from end of etching to wafer extraction;

FIG. 19 is a perspective view schematically showing a plasma processing apparatus suitable for plasma processing of a large-sized object to be processed;

FIG. 20 is a sectional view showing a plasma processing apparatus in which a plasma processing space is formed below an object to be processed;

FIG. 21 is a sectional view showing a plasma processing apparatus in which a plasma processing space is formed on a side of an object to be processed;

FIG. 25 is a graph showing the pressure dependencies of the electron density and the electron temperature obtained by experiments;

FIG. 26 is a graph showing the power dependencies of the electron density and the electron temperature obtained by experiments;

FIG. 29 is a graph showing the pressure dependency of the emission intensity, which is obtained by experiments;

FIG. 30 is a partially cutaway perspective view showing a modification of a discharge system;

DETAILED DESCRIPTION OF THE PREFERRED EMBODIMENTS

Figure 1:
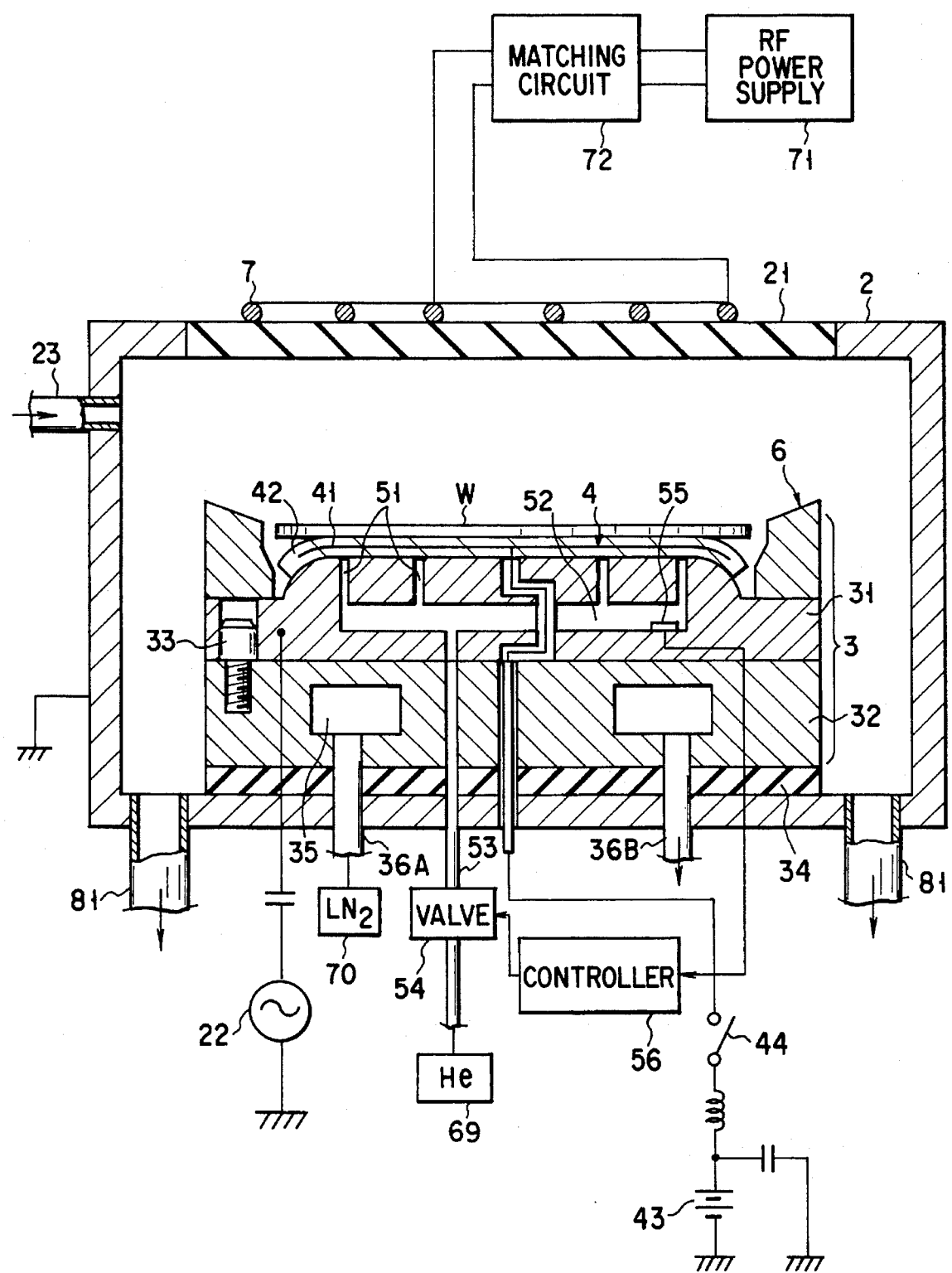
FIG. 1 is a sectional view showing the overall arrangement of a plasma processing apparatus according to the first embodiment of the present invention.
Figure 2:
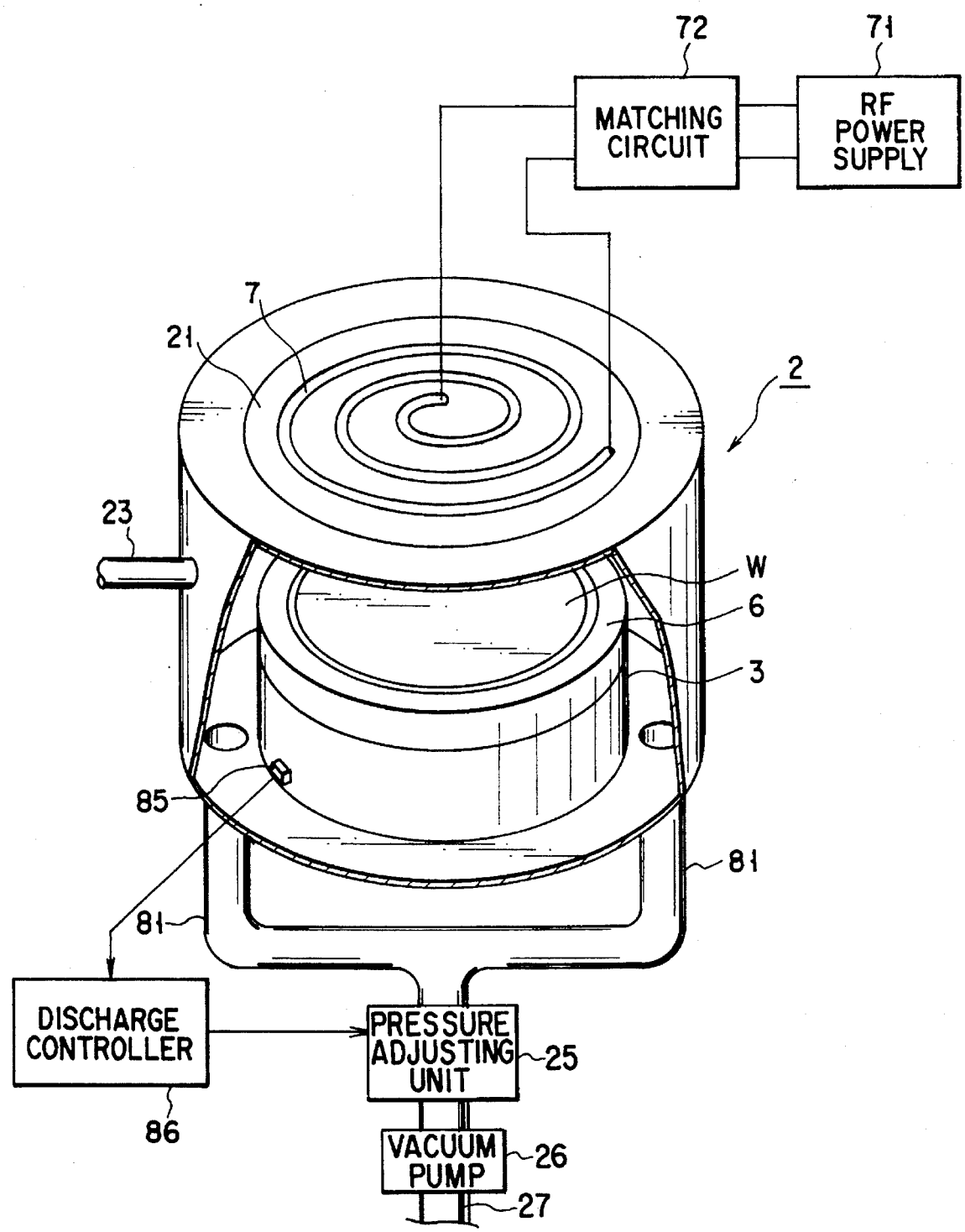
FIG. 2 is a schematic perspective view showing the outline of the overall arrangement of the first embodiment of the present invention.

FIG. 1 is a sectional view showing the overall arrangement of a plasma processing apparatus according to an embodiment of the present invention, e.g., an etching apparatus, and FIG. 2 is a partially cutaway schematic perspective view of the same. Referring to FIGS. 1 and 2, reference numeral 2 denotes a cylindrical air-tight chamber or processing chamber constituted by a conductive material, e.g., aluminum, excluding part of its upper wall, i.e., its central portion. A rest table as susceptor 3 made of a conductive material, e.g., aluminum, is arranged at the central bottom portion in the chamber 2.

The rest table 3 is constituted by separably coupling, with a bolt or bolts 33, a rest section 31 as an upper portion and a support section 32 as a lower portion that supports the rest section 31 thereon. An insulator 34 is interposed between the bottom surface of the support section 32 and the bottom wall of the chamber 2 in order to electrically separate the support section 32 and the chamber 2 from each other. An electrostatic chuck sheet 4 is provided on the upper surface of the rest section 31 to cover the upper surface of the rest section 31 excluding the peripheral portion thereof. The electrostatic chuck sheet 4 is constituted by covering a conductive film 41 serving as an electrostatic chuck sheet electrode made of, e.g., a copper foil, from the two sides with insulating films 42 made of a material, e.g., an insulating polymer such as a polyimide film, ceramic, or quartz, which has a high resistance against reactive ions. The conductive film 41 is electrically connected to a DC power supply 43 outside the chamber 2 through a switch 44.

Figure 3:
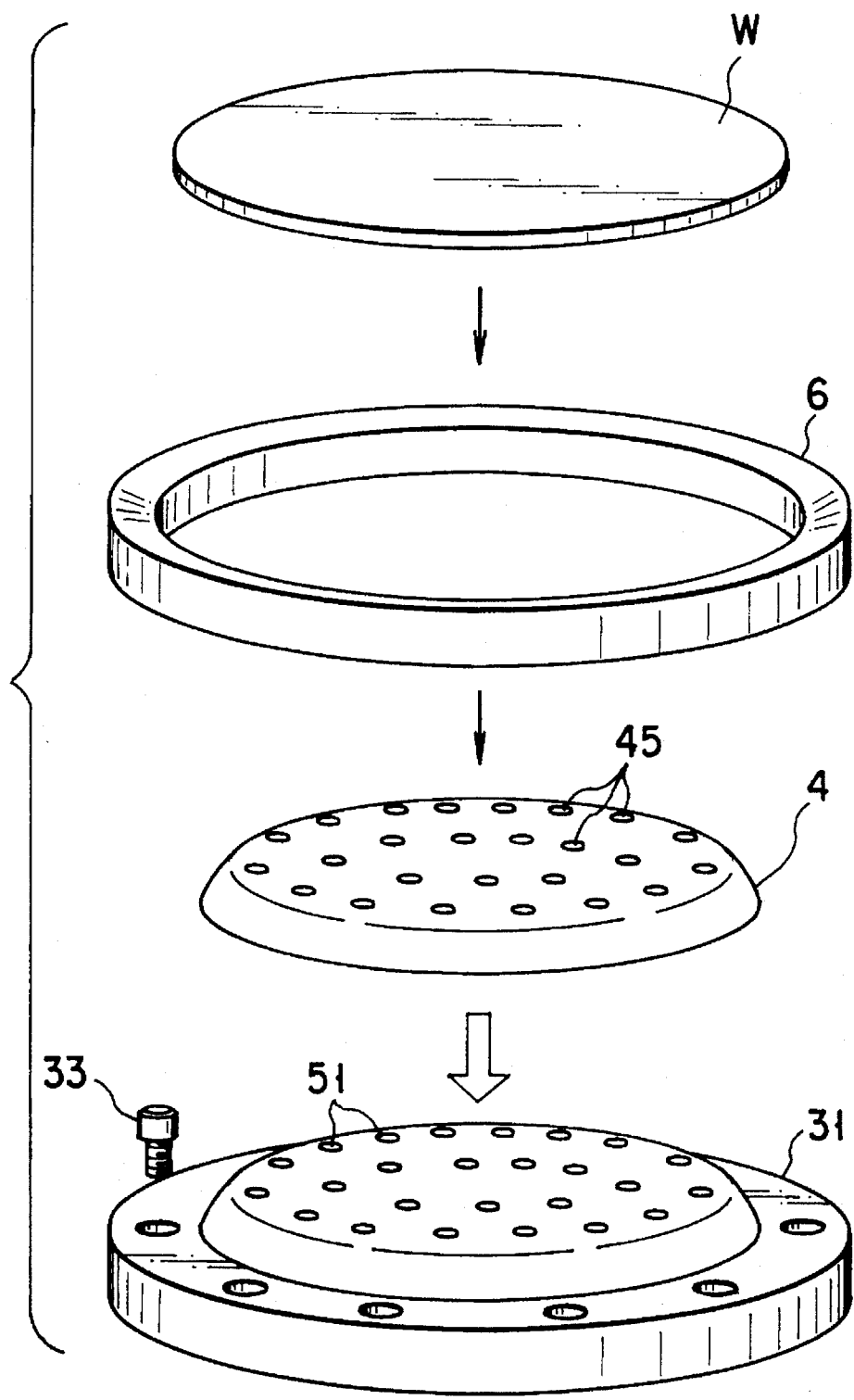
FIG. 3 is an exploded perspective view showing the support structure for a wafer.
Figure 4:
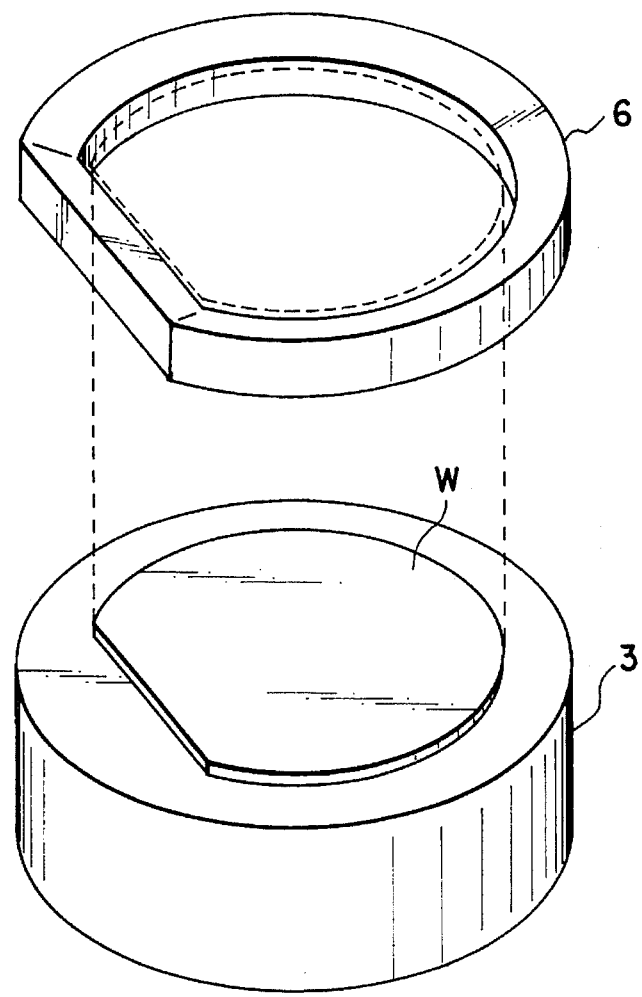
FIG. 4 is an exploded perspective view showing a rest table and a focus ring.

A large number of vertical through holes 51 for back-side gases (gases for heat conduction) are formed in the rest section 31 with a uniform distribution to have upper ends open in the upper surface of the rest section 31. The lower ends of the holes 51 communicate with, e.g., a vent chamber 52 which extends horizontally. The vent chamber 52 is connected to a gas supply source 69 of, e.g., He gas, through a gas supply path 53 for the back-side gases, which extends to outside the chamber 2 through the support section 32, the insulator 34, and the bottom wall of the chamber 2. A pressure adjusting unit 54, e.g., a butterfly valve, is provided midway along the gas supply path 53. Vertical through holes 45 (shown in FIG. 3) are similarly formed in the electrostatic chuck sheet 4 at positions corresponding to the respective holes 51. The back-side gases supplied from the through holes 51 are fed to the upper surface of the electrostatic chuck sheet 4 through the holes 45 in the electrostatic chuck sheet 4 and are blown against the lower surface of a wafer W as an object to be processed which is placed on the electrostatic chuck sheet 4. The gas supply path 53 is connected to the gas supply source 69.

The vent chamber 52 is provided with a pressure detector 55 for detecting the pressure of the back-side gases in the vent chamber 52 and for generating an electrical signal corresponding to the detected pressure. A controller 56 included in the control system of the apparatus of the present invention is connected to the output of the pressure detector 55. The controller 56 adjusts the opening degree of the pressure adjusting unit 54, the butterfly valve, based on the pressure detected by the pressure detector 55 such that the pressure of the back-side gases blown from the holes 51 toward the lower surface of the wafer W is maintained at a predetermined value, e.g., about 10 Torr.

Figure 5:
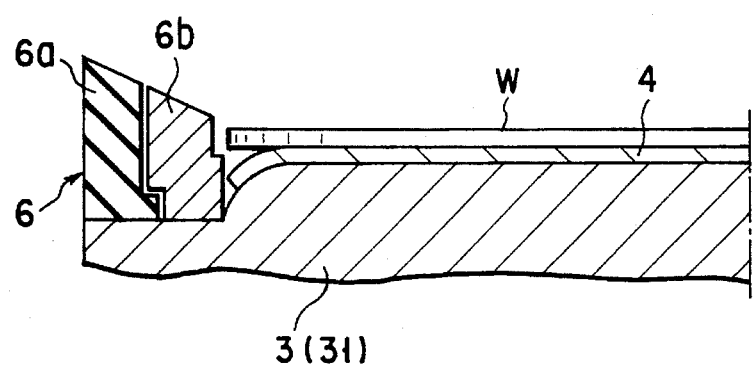
FIG. 5 is a diagram for explaining the positional relationship between the rest table and the focus ring.

A plasma focus ring or directing ring 6 is provided on the upper surface of the rest table 3 to surround the wafer W. The focus ring 6 is made by an insulator, e.g., ceramic or quartz, or is constituted by an outer annular member 6a made of an insulator as described above and an inner annular member 6b made of a conductive material, e.g., carbon, as shown in FIG. 5 in detail. The inner circumferential surface of the focus ring 6 is formed to be similar to the outer circumferential surface of the wafer W, so that the clearance between the circumferential surface is uniformly kept at every points and is inclined to be raised from the inner peripheral edge toward the outer peripheral edge. When the focus ring 6 is made only of an insulator, assuming that an 8-inch wafer is to be processed, the ring width of the focus ring 6 is set to 30 mm, the height of the outer peripheral edge of the focus ring 6 with respect to the surface of the wafer W is set to 2 mm, the clearance between the wafer W and the inner edge of the focus ring 6 is set to 0.5 mm, and the height of the inner peripheral edge of the focus ring 6 with respect to the surface of the wafer W is set to 1.5 mm. When the focus ring 6 is made of the outer annular member 6a and the inner annular member 6b, it is preferable that they be slightly separated from each other. The insulating member of the focus ring 6 serves to cause the lines of electric force in the chamber 2 to be attracted by the central portion of the chamber 2 so as to be substantially parallel to the wafer W. In this embodiment, the focus ring 6 is made of an insulator. However, the focus ring 6 is not limited to an insulator but can be constituted by a high resistor (including a conductive high resistor and a material having a resistance corresponding to that of a semiconductor).

When the focus ring 6 is constituted by the outer and inner annular members 6a and 6b, as described above, the plasma is oriented upward by the outer annular member 6a. However, since the lines of electric force spread outward where the inner annular member 6b is placed, the lower surface region of the plasma is spread laterally. Thus, the flatness at the peripheral portion of the wafer W is improved, thereby increasing the in-plane uniformity of plasma processing (this will be described later in detail with reference to FIG. 8).

A coolant reservoir 35 is formed in the support section 32 in order to circulate a coolant therein, thereby cooling the wafer W through the rest table 3. The coolant reservoir 35 is provided with an inlet pipe 36A connected to a coolant supply source 70, and a discharge pipe 36B connected to the source 70 through cooling means which is not shown. The coolant supplied into the coolant reservoir 35 through the inlet pipe 36A, e.g., liquid nitrogen having a temperature of −190° C., cools the rest table 3 to −50° to −150° C., and is discharged to outside the apparatus through the discharge pipe 36B, as indicated by an arrow in FIG. 1.

The central portion of the upper wall of the chamber 2 opposing the rest table 3 is constituted by an insulating member, e.g., an insulating plate 21 made of quartz glass or ceramic, and an RF antenna 7 made of a flat coil, such as a spiral coil, which is made of copper, aluminum, stainless steel, or the like is fixed to the upper surface of the insulating plate 21. An RF voltage having, e.g., 13.56 MHz and 1 kW, is applied across the two terminals (inner and outer terminals) of the RF antenna 7 from a plasma-generating RF power supply 71 through a matching circuit 72. Thus, an RF current flows through the RF antenna 7, and a plasma is generated in the space in the chamber 2 immediately under the RF antenna 7, as will be described later.

An RF power supply 22 is connected between the rest table 3 and the ground in order to apply a bias voltage having a frequency lower than the frequency of the RF voltage to be supplied to the RF antenna 7, e.g., 1 to 3 MHz and more preferably 2 to 3 MHz, to the rest table 3. The chamber 2 is connected to ground. Thus, an electric field is generated between the rest table 3 and the chamber 2. As a result, the perpendicularity of incidence of reactive ions in the plasma in the chamber 2 with respect to the wafer W is increased.

A gas supply pipe 23 is provided in the upper portion of the side wall of the chamber 2. A process gas to be supplied into the chamber 2 through the gas supply pipe 23 differs depending on the type of processing. For example, when etching is to be performed, an etching gas, e.g., $CHF_3$ or $CF_4$, is supplied. In FIG. 1, only one gas supply pipe 23 is shown. However, an appropriate number of gas supply pipes arranged in a predetermined interval may be connected to the chamber 2 in order to uniformly supply a process gas.

One end of each of a plurality of discharge pipes 81 is connected to the bottom surface of the chamber 2 at such a position that the discharge pipes 81 are equidistant in the circumferential direction of the chamber 2. In FIG. 1, one end of each discharge pipe 81 is connected, such that the two discharge pipes 81 are symmetrical with respect to the axis of the chamber 2. The other end of each discharge pipe 81 is connected to a common discharge pipe 84 having a pressure adjusting unit 82, e.g., a butterfly valve, and a vacuum pump 83, as shown in FIG. 2. A mechanical shutter (not shown) is preferably provided to the discharge pipe 84, so that the opening degree of the pressure adjusting unit 82 is adjusted by an external operation. In this embodiment, a discharge controller 86 adjusts the pressure adjusting unit 82 based on a detected pressure value obtained by a pressure detector 85 provided in the chamber 2, so that the discharge system slowly performs discharge in the initial state of evacuation so as not to scatter particles and performs rapid discharge after evacuation is performed to a certain degree.

The operation of this device will be described. First, an object to be processed, e.g., a semiconductor wafer W, is loaded into the chamber 2 and placed on the electrostatic chuck sheet 4 by a convey arm (not shown). The interior of the chamber 2 is evacuated by the vacuum pump 83 through the discharge pipes 81 to a predetermined vacuum atmosphere. Evacuation of the interior of the chamber 2 is performed through the discharge pipes 81, while supplying an etching gas, e.g., $CF_4$, from the gas supply pipe 23 into the chamber 2, in order to maintain the interior of the chamber to a vacuum degree of, e.g., several mTorr to several tens mTorr. Simultaneously, an RF voltage is applied to the RF antenna 7 by the RF power supply 71. When an RF current flows through the RF antenna 7 upon application of the RF voltage, an alternating magnetic field is generated around the antenna conductor, and most of the magnetic fluxes run through the central portion of the RF antenna 7 in the vertical direction, thereby forming a closed loop. An alternating electric field is induced by this alternating magnetic field immediately under the RF antenna 7 almost concentrically in the circumferential direction. The electrons accelerated in the circumferential direction by the alternating electric field collide against the neutral particles in the process gas to ionize the gas, thereby generating a plasma. The reactive ions in the plasma generated in this manner etch the surface of the wafer W.

Since the focus ring 6 having an insulator or a high resistor is provided around the wafer W, the lines of electric force are apt to separate from the focus ring 6, so that the plasma is concentrated to the center of the wafer W. Since the upper surface of the focus ring 6 is inclined to be raised toward its outer side, high concentration of the plasma can be achieved, as indicated by a broken line in FIG. 6. At the same time, since the lower surface of the plasma is not attracted by the inner side abruptly, but is attracted by it in an arcuated manner, the flatness of the lower surface of the plasma at the peripheral portion of the wafer W can be ensured. As a result, high-efficiency plasma processing having a high in-plane uniformity can be performed. When the height of the upper surface of the focus ring 6 and the angle of the inclined surface are adjusted, the degree of concentration of the plasma and the shape of the lower surface of the plasma can be adjusted.

When a silicon-based film made of, e.g., silicon dioxide or polysilicon, is etched, a compound of a halogen and silicon attaches as a reaction product to the discharge system, e.g., to the interior of a discharge pipe. In this etching, after a predetermined number of wafers W are processed, $ClF_3$ gas may be supplied from the process gas supply pipe 23 into the chamber 2 at, e.g., a flow rate of 10 to 5,000 sccm and a pressure of 0.1 to 100 Torr, and thereafter the interior of the chamber 2 may be evacuated. Then, the reaction product attaching to the discharge system can be cleaned with the ClF$_3$ gas.

In this embodiment, the insulator portion of the focus ring or directing means 6 has an inclined surface. However, even if a plurality of stepped portions are formed to be lowered toward the inner side of the focus ring 6, as shown in FIG. 7A, an L-shaped focus ring 6 is formed, as shown in FIG. 7B, or the outer portion of the focus ring 6 is inclined while the inner portion of the focus ring 6 is formed flat, as shown in FIG. 7C, the same effect can be obtained. The inner portion of the focus ring 6 may be lower than or level with the surface of the wafer W. It suffices if the height of the directing ring 6 is appropriately set in accordance with the density of the plasma and the like so that the flatness at the peripheral portion of the wafer W can be ensured.

If the insulator portion of the focus ring 6 is formed such that its outer side is higher than its inner side, it is preferable because the flatness of the peripheral portion of the lower surface of the plasma is improved. However, the present invention does not necessarily limit the relationship in height between the outer and inner sides of the upper surface of the focus ring 6 as described above. From the viewpoint of obtaining a high plasma concentration effect, the upper surface of the focus ring 6 may be a flat surface parallel to the wafer W as far as it is higher than the surface of the wafer W.

FIG. 8 shows an arrangement of a focus ring in which the upper surface of an inner annular member 6b of the insulator forms a stepped portion and an outer annular member 6a of the conductor is set to be lower than the surface of the wafer with this arrangement, the plasma is oriented upward by the inner annular member 6b. However, at a portion where the outer annular member 6a is placed, since the lines of electric force spread outwardly, the lower surface of the plasma is spread laterally, as indicated by a solid line (a broken line indicates the shape of a plasma obtained when the outer annular member 6a is constituted by an insulator for the purpose of comparison), so that the flatness at the peripheral portion of the wafer W is improved. As a result, the in-plane uniformity of plasma processing can be improved.

In utilization of the RF induction method, its preferable embodiment for preventing the wafer W from being damaged by an electric field will be described. When the plasma is upright, an electric field generated by the RF antenna 7 does not reach the wafer W due to the skin effect. However, when the plasma is not upright, this electric field reaches the wafer W, and the surface of the wafer W can be damaged by the electric field component in the vertical direction. Therefore, as shown in FIG. 9, a mechanical shutter 8 having a size which is the same as or larger than that of the wafer W may be provided to be reciprocal. Alternatively, a rest table 3 may be formed to be vertically movable. When an electric field is generated, the rest table 3 is retreated downward so that the electric field does not reach the wafer W. Alternatively, an RF power may be supplied to an RF antenna only after the process gas atmosphere in the chamber 2 reaches a predetermined pressure.

Plasma processing apparatuses according to different embodiments will be sequentially described with reference to FIGS. 10 to 23. In these embodiments, members which are substantially the same as those in the above embodiment will be denoted by the same reference numerals, and a detailed description thereof will be omitted.

Figure 10:
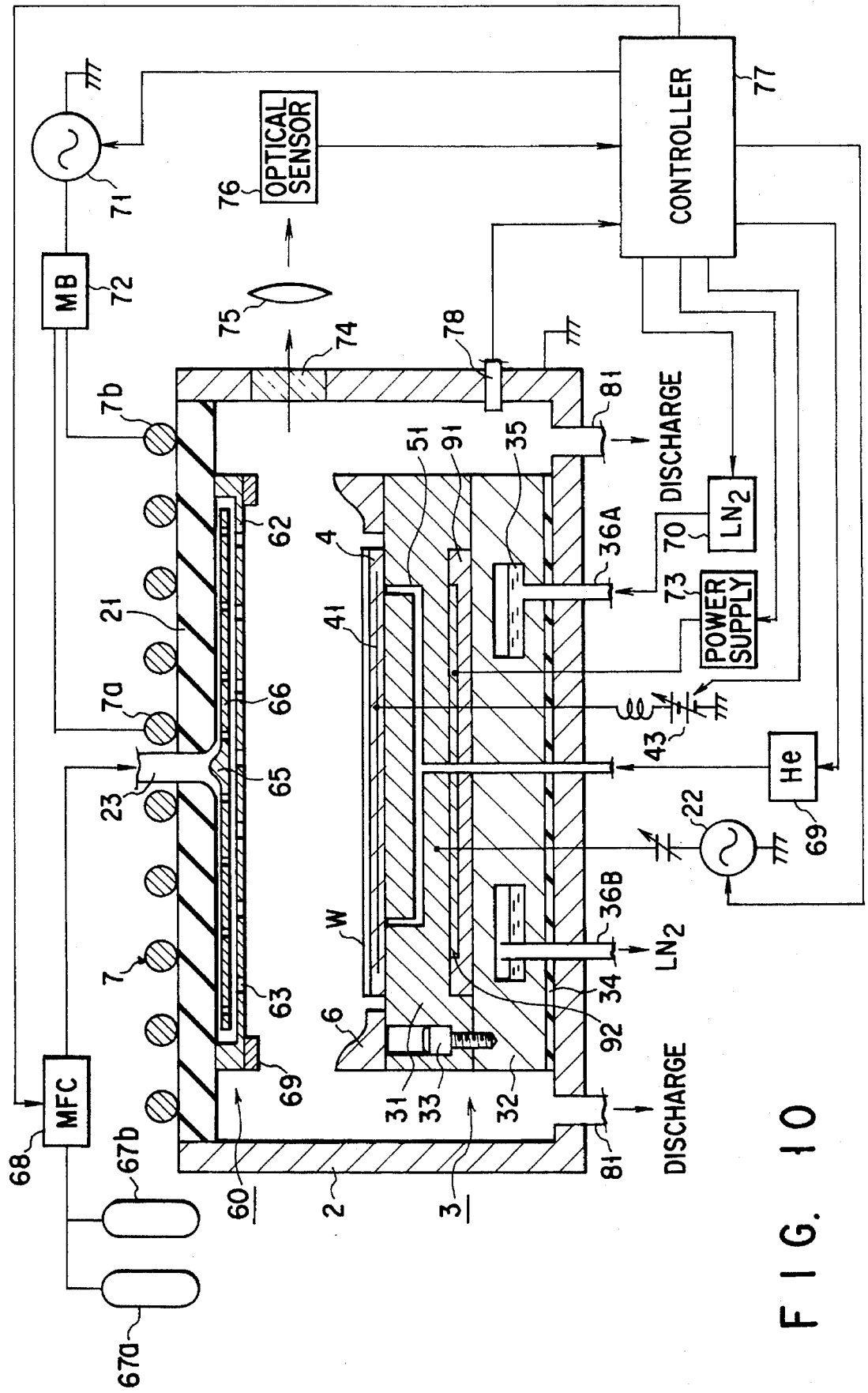
FIG. 10 is a sectional view showing a plasma processing apparatus according to the second embodiment.

In an apparatus shown in FIG. 10, a gas supply pipe 23 is provided to extend through an insulating plate 21 in order to supply a gas into a chamber 2. The gas supply pipe 23 is associated with a gas supplying means 60 provided above a rest table 3. The gas supplying means 60 is constituted by a disk having almost the same area as that of the upper surface of the rest table 3, and a peripheral plate projecting upward from the outer peripheral portion of the disk and having an upper end mounted to the insulating plate 21. The inner surfaces of the disk and the peripheral plate, and the inner surface of the insulating plate 21 define a gas buffer chamber. The gas supply pipe 23 extends through the insulating plate 21 to correspond to the central portion of this disk and is open in the buffer chamber. A large number of small through holes 63 are formed in the disk of the gas supplying means 60 to have a predetermined distribution. A buffer disk 66 having a diameter slightly smaller than that of the above disk is coaxially disposed in the buffer chamber so as to maintain a gap between its upper, lower, and circumferential surfaces and the inner surface of the buffer chamber. A hill-like projecting portion 65 is formed on the central portion of the upper surface of the buffer disk 66 to oppose the gas supply pipe 23.

The gas supply pipe 23 is connected to gas sources (etching gas sources in this embodiment) 67a and 67b, provided outside the chamber 2, through a mass flow controller 68. Gases supplied from the gas sources enter the buffer chamber as their flow rates are adjusted by the mass flow controller 68. Mixing of the gases is promoted in the buffer chamber, and the gases are supplied into the chamber 2 at equal flow rates through the small through holes 63. An annular projection 69 is formed on the peripheral portion of the lower surface of the gas supplying means 60 such that it projects downward. This annular projection 69 directs the gases, supplied into the chamber 2 through the small through holes 63, toward the wafer.

A temperature-adjusting heater 92 housed in a heater fixing box 91 is provided between a rest section 31 and a support section 32, and is connected to a power supply 73. The power supply 73 is controlled to adjust power supply to the heater 92, in order to control cooling of the rest table 3 by a coolant reservoir 35, thereby temperature-adjusting the surface to be processed of a wafer W.

The control system of the processing apparatus having the above arrangement will be described.

A transmitting window 74 made by a transparent material, e.g., quartz glass, is attached in an opening formed in one side wall of the chamber 2. Light emitted from the plasma in the processing chamber passes the window and is incident on an optical sensor 76 through an optical system 75. The optical sensor 76 sends a signal concerning the emission spectrum of the incident light to a controller 77.

A pressure sensor 78 for detecting the pressure in the processing chamber is mounted on the side wall of the chamber 2. The pressure sensor 78 sends a signal concerning the pressure to the controller 77. As a result, during etching, the controller 77 constantly sends control signals to the mass flow controller 68, RF power supplies 22 and 71, a gas supply source 69, the power supply 73, and the coolant supply source 70 based on the output signals from the sensors 76 and 78 and a preset reference signal, thereby controlling them to perform optimum etching.

A system for supplying wafers to the plasma processing apparatus will be described with reference to FIG. 11.

A load-lock chamber 96 is connected to one side wall of the processing chamber 2 through a first gate valve 95 which can open/close freely. The load-lock chamber 96 is provided with a convey unit 97, e.g., a convey arm obtained by coating an aluminum arm with conductive Teflon for electrostatic shielding. The convey arm can be extended and pivoted by a known mechanism. A discharge pipe 101 is connected to the load-lock chamber 96 through a discharge port formed in the bottom wall of the load-lock chamber 96, and the discharge pipe 101 is connected to a vacuum pump 83 through a vacuum discharge valve 102. As a result, the interior of the load-lock chamber 96 can be evacuated to a vacuum state by the vacuum pump 83.

A cassette chamber 99 is connected to a side wall of the load-lock chamber 96, opposite to the side wall where the first gate valve 95 is provided, through a second gate valve 98 which can open/close freely. A rest table 104 for placing a cassette 100 thereon is provided in the cassette chamber 99. The cassette 100 can accommodate, e.g., 25 wafers W as one lot. A discharge pipe 105 is connected to the cassette chamber 99 through a discharge port formed in the bottom wall. The discharge pipe 105 is connected to the vacuum pump 83 through a vacuum discharge valve 106. As a result, the interior of the cassette chamber 99 can be evacuated to a vacuum state by the vacuum pump 83. The other side wall of the cassette chamber 99 can communicate with the outside through a third gate valve 107 which can open/close freely.

The operation of the convey system having the above arrangement will be described.

First, the third gate valve 107 is opened, the cassette 100 accommodating the wafers W is placed on the rest table 104 in the cassette chamber 99 by a convey robot (not shown), and the third gate valve 107 is closed. Subsequently, the vacuum discharge valve 106 is opened, and the interior of the cassette chamber 99 is evacuated by the vacuum pump 83 to, e.g., $10^{-1}$ Torr.

The second gate valve 98 is opened, and the convey arm 97 is extended into the cassette chamber 99 to receive one wafer W from the cassette 100 and to transport it into the load-lock chamber 96. Thereafter, the second gate valve 98 is closed. Simultaneously, the vacuum discharge valve 102 is opened, and the interior of the load-lock chamber 96 is evacuated by the vacuum pump 83 to, e.g., $10^{-3}$ Torr.

The first gate valve 95 is opened, and the convey arm 97 is extended to convey the wafer W to above the rest table in the processing chamber 2, in order to transfer it to the distal ends of a plurality of, e.g., three pusher pins (not shown). Thereafter, the convey arm 97 is returned into the load-lock chamber 96, and the first gate valve 95 is closed to hermetically seal the processing chamber 2. Subsequently, as shown in FIG. 12A, an RF voltage is applied to an electrostatic chuck 4 (Step 1). The pusher pins are moved downward to place the wafer on the electrostatic chuck 4, and the wafer is chucked on the electrostatic chuck 4 electrostatically (Step 2). These pusher pins can extend through the rest table vertically and can be moved in the vertical direction in an synchronous manner by a drive source provided below the processing chamber, which movements are achieved by a known technique. During the wafer fixing operation, a pressure adjusting valve 82 is opened, and the interior of the processing chamber 2 is evacuated by the vacuum pump 83 to, e.g., $10^{-5}$ Torr.

When the pressure sensor 78 detects that an optimum pressure atmosphere for obtaining an optimum etching rate, obtained in advance by using a dummy wafer, is reached, an RF energy is supplied from the RF power supply 71 to an RF antenna 7, thereby generating a plasma in the processing chamber 2 (Step 3). Thereafter, a back-side gas is supplied between the lower surface of the wafer and the electrostatic chuck 4, so that the wafer is set to a predetermined temperature (Step 4). Finally, a bias RF voltage is applied to the rest table 3 to start etching (Step 5). When etching is started with these steps, the wafer will not be accidentally removed from the electrostatic chuck 4 upon pressure reduction in the processing chamber.

When predetermined etching is completed, as shown in FIG. 12B, the operation of the RF power supply 22 is stopped first to disconnect the bias potential (Step 10), and supply of the back-side gas is stopped (Step 11). Then, the RF power supply 71 is turned off to stop generation of the plasma in the processing chamber (Step 12). Subsequently, in order to replace the process gas and the reaction product in the processing chamber 2, an inert gas, e.g., nitrogen, is supplied into the chamber 2 through a port 65, and the pressure adjusting unit 82 is opened to evacuate the interior in the processing chamber 2 with the vacuum pump 83. After the residual process gas and reaction product in the chamber are sufficiently discharged, the switch of a DC power supply 43 is turned off, thereby canceling chucking of the wafer by the electrostatic chuck 4 (Step 13). The pusher pins are moved upward to lift the wafer from the electrostatic chuck 4. The first gate valve 95 is opened, and the convey arm 97 is inserted into the processing chamber 2 to receive the wafer from the pusher pins and to convey it into the load-lock chamber 96. Thereafter, the first gate valve 95 is closed to hermetically seal the load-lock chamber 96. The wafer is heated by a heater (not shown) in the load-lock chamber 96 to room temperature, e.g., 18° C. Then, the second gate valve 98 is opened, and the wafer is conveyed into the cassette 100 in the cassette chamber 99. After a predetermined number of wafers are accommodated in the cassette 100 in this manner, the third gate valve 107 is opened, and the cassette 100 is removed to the outside of the apparatus.

Figure 11:
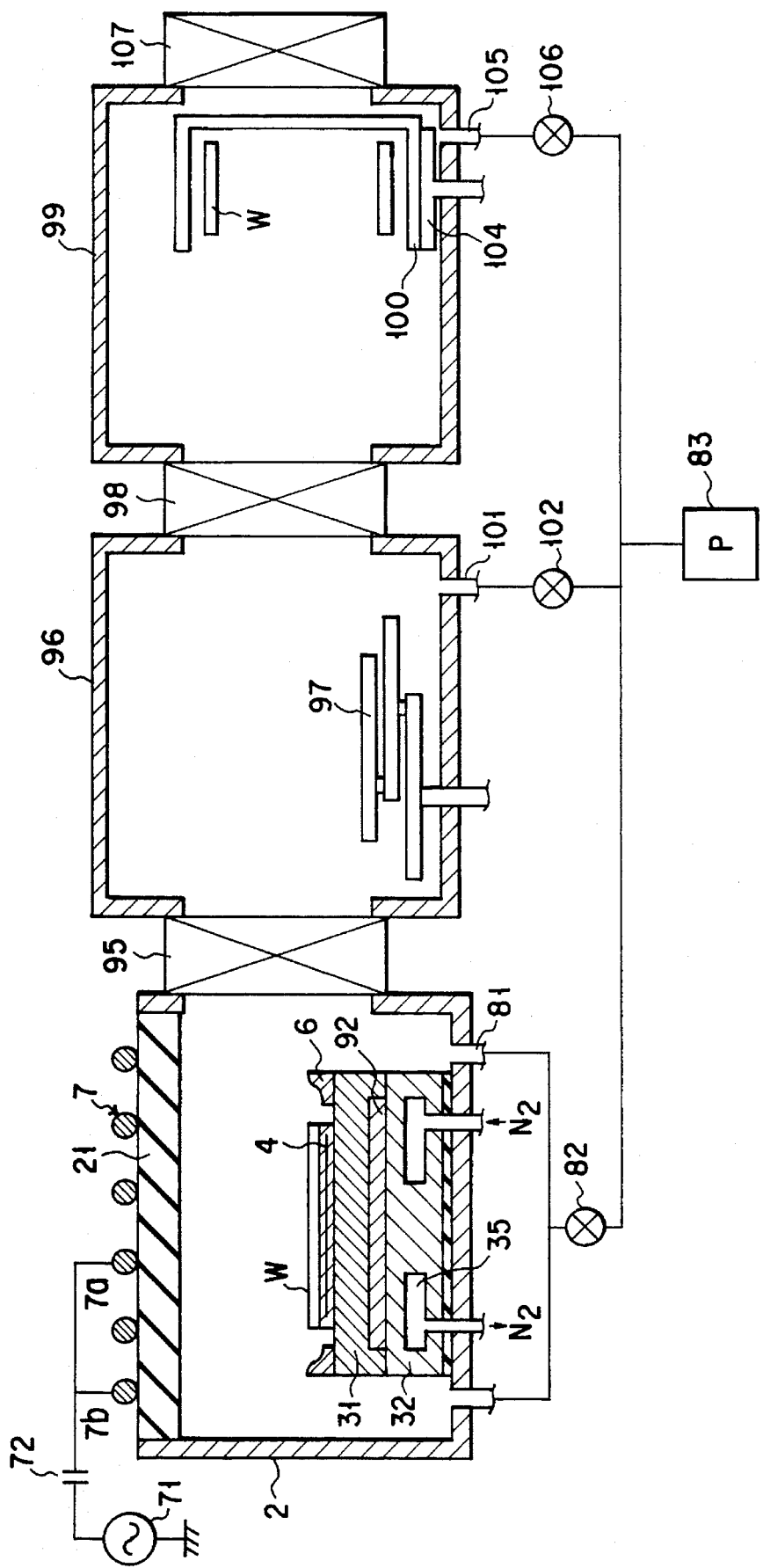
FIG. 11 is a diagram schematically showing a system for supplying wafers to the plasma processing apparatus according to the second embodiment.

Results of an experiment for measuring selectivities, obtained when a silicon dioxide film formed on a polysilicon substrate is etched as a body W to be processed with the etching apparatus having the arrangement as shown in FIGS. 10 and 11, will be described with reference to Table 1.

The conditions of the experiment are as follows. A bias voltage of 100 W was applied by the RF power supply 22 to the rest table 3, placing the body W to be processed thereon, in order to attract ions from the plasma that processes the surface of the body W to be processed. An RF wave of 1,000 W was applied to the RF antenna 7 by the RF power supply 71. Under these conditions, selectivities obtained when $CF_4$ gas and $CH_4$ gas were supplied by the gas supplying means 60 at flow rates of 30 sccm/26 sccm were measured. The results are shown in Table 1.

TABLE 1

| RFi: 1000 W Bias: 100 W | | |
|---|---|---|
| $CF_4$: 30 sccm | | : 50 sccm |
| $CH_4$: 26 sccm | | : 33 sccm |
| D-Poly | 38.2 | 23.4 |
| ND-Poly | 40.9 | 30.2 |

Differences in selectivity of D-poly representing a phosphorus-doped polysilicon substrate and ND-poly representing a non-doped polysilicon substrate were studied. As shown in Table 1, the selectivities of $SiO_2$/poly-Si were 23.4 to 40.9, thus obtaining high selectivities.

As indicated in Table 1, the selectivity depends on the ratio of the flow rate of $CF_4$ to that of $CH_4$ and changes largely while maintaining a high selectivity. Therefore, an optimum high selectivity can be selected by considering other conditions, e.g., etching shapes, uniformity of the object to be processed in a surface to be processed, and the like.

The shape of the side wall obtained by etching can be improved by adding $O_2$ gas to the $CF_4$ gas and the $CH_4$ gas in an amount less than about 10% in the ratio of the flow rate. The same effect can be obtained by adding Ar gas in an amount less than 50% in the ratio of the flow rate. Also, a gas system obtained by mixing $NF_3$ gas and $CH_4$ gas can provide a sufficiently high selectivity in oxide film etching of an underlying silicon layer or a resist film. In this case as well, the shape of the side wall obtained by etching can be improved by adding $O_2$ or $Ar_2$ gas to this gas system in the same manner as described above.

As a technique for preventing a reaction product, formed when a silicon dioxide film is etched by the $CF_4$ gas and the $CH_4$ gas during etching, from attaching to the inner wall of the reaction chamber in which etching is performed, the inner wall may be heated by a heating means, e.g., a heater wire, to a temperature of 50° to 100° C., more preferably to an appropriate temperature of 60° to 80° C. If the reaction product can be prevented from attaching to the inner wall of the reaction chamber in this manner, contamination of the substrate to be processed caused by peeling of the attached product can be prevented.

Figure 13:
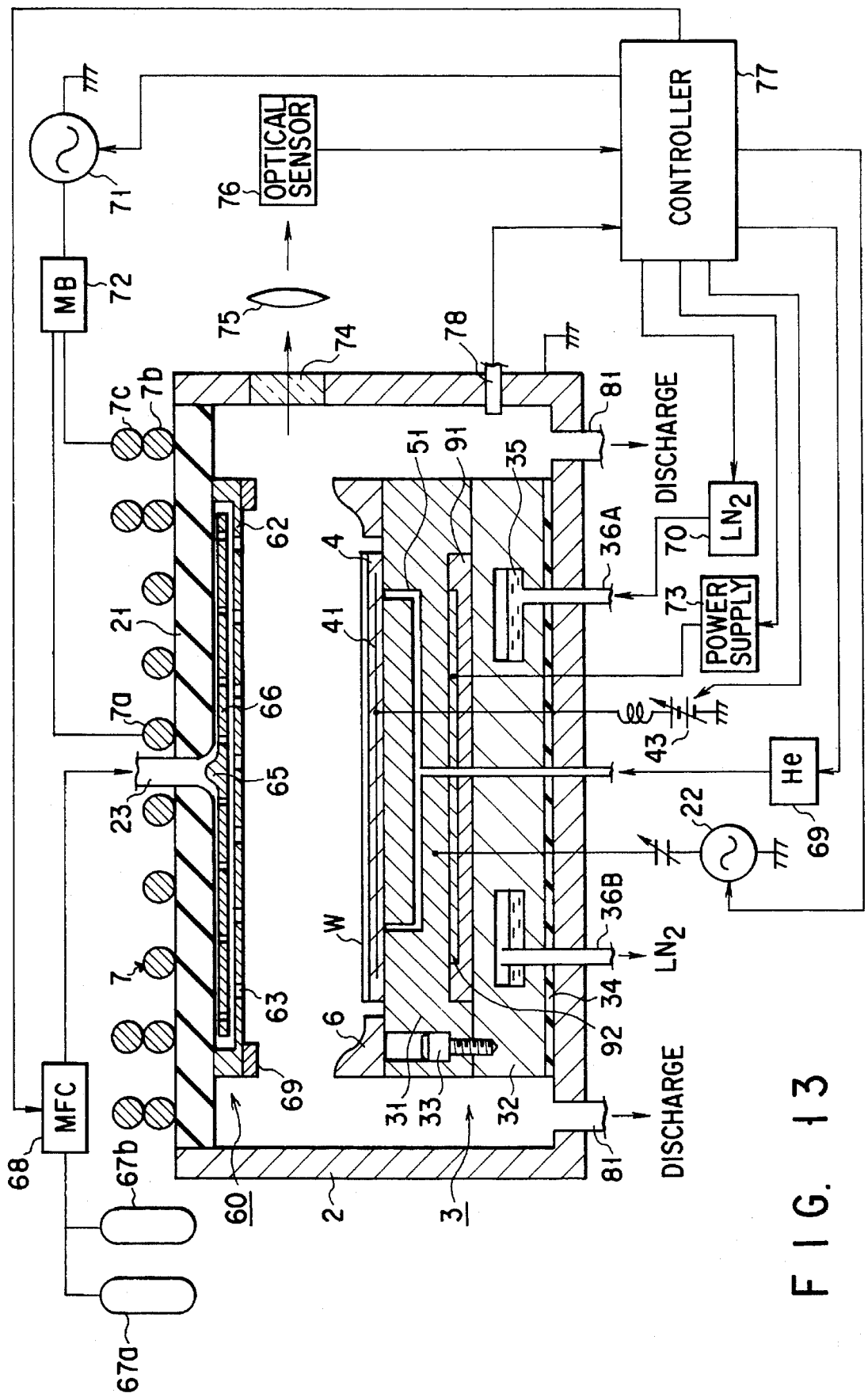
FIG. 13 is a view showing a modification of the apparatus shown in FIG. 10 which has a different RF coil.

A processing apparatus of an embodiment shown in FIG. 13 is different from that of the embodiment shown in FIG. 10 in an RF antenna 7 mounted on the outer wall surface of an insulating member 5. In this embodiment, a portion 7c of the RF antenna 7 constituted by a spiral coil is wound in two layers, and a strong electromagnetic field can be generated by the resultant overlapping portion constituted by a portion 7b and the portion 7c. When the number of turns of the spiral coil is partially changed in this manner, the distribution of the density of the plasma excited in a processing chamber 2 can be adjusted. In the embodiment shown in FIG. 13, the overlapping portion of the RF antenna 7 is set at its outer peripheral portion. However, the overlapping portion can be set at an arbitrary portion of the RF antenna 7 in accordance with a necessary plasma density distribution. In the embodiment shown in FIG. 13, the overlapping portion of the RF antenna 7 is constituted by only two layers. However, the overlapping portion can have an arbitrary number of layers in accordance with a necessary plasma density distribution.

Figure 14:
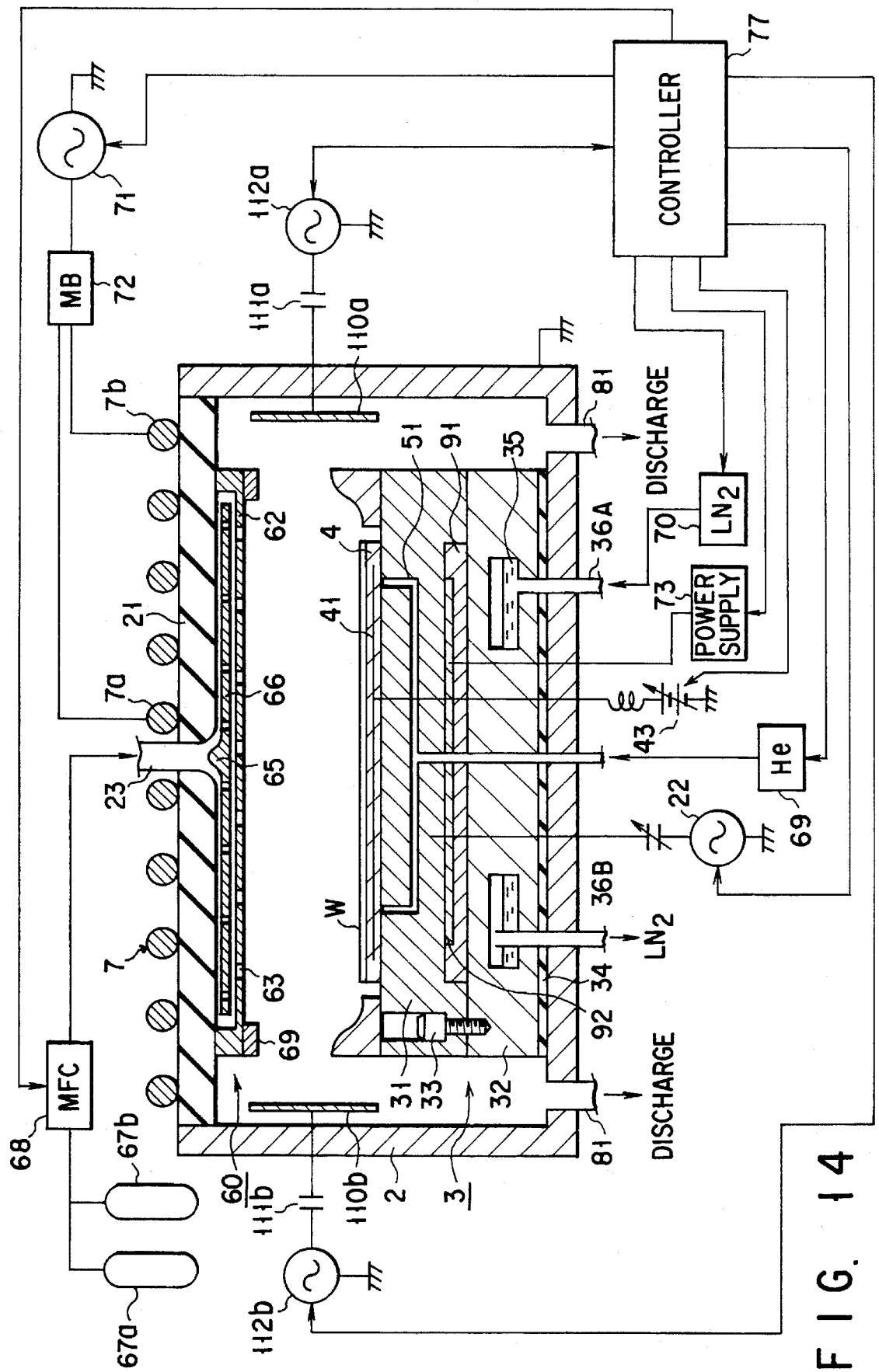
FIG. 14 is a view showing a modification of the apparatus shown in FIG. 10 to which a bias electrode is added.

In a plasma processing apparatus of an embodiment shown in FIG. 14, a plurality of (two in this embodiment, but can be more than two) second electrodes 110a and 110b made of, e.g., aluminum are radially arranged in a processing chamber 2 to surround a rest table 3 at equal angular intervals. The electrodes 110a and 110b are respectively connected to RF power supplies 112a and 112b through matching circuits 111a and 111b. The RF power supplies 112a and 112b can be drive-controlled by a controller 77. With this arrangement, in addition to the RF bias energy applied to the rest table 3, an RF bias energy can also be applied to the second electrodes 110a and 110b that radially surround the surface to be processed of a body W to be processed at equal angular intervals. Therefore, the plasma excited in the processing chamber 2 can be controlled to an optimum state by adjusting the intensity, amplitude, phase, frequency, and the like of the respective RF energies.

Figure 15:
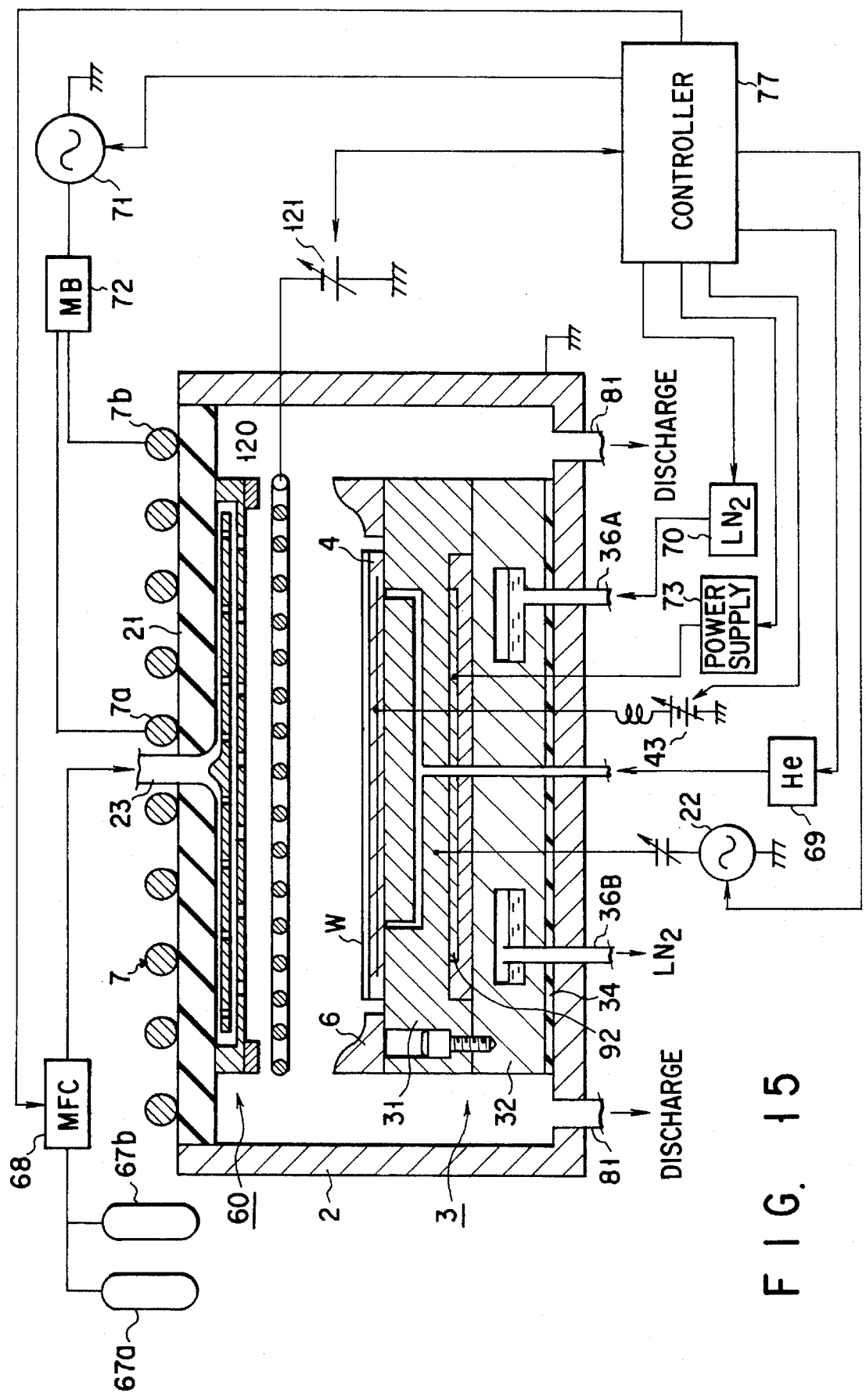
FIG. 15 is a view showing a modification of the apparatus shown in FIG. 10 to which a control electrode is added.

In a plasma processing apparatus of an embodiment shown in FIG. 15, a mesh-type electrode 120 made of, e.g., silicon or aluminum is horizontally arranged below the gas blow surface of a gas supplying means 60 and above a rest table 3 in a processing chamber 2. The electrode 120 is connected to a variable power supply 121 whose output voltage is controlled by a controller 77. When an appropriate current is supplied to the electrode 120, the distribution of an electric field generated in the processing chamber 2 by the operation of an RF antenna 7 can be controlled, thereby exciting a plasma having a desired density distribution in the processing chamber 2.

Figure 16:
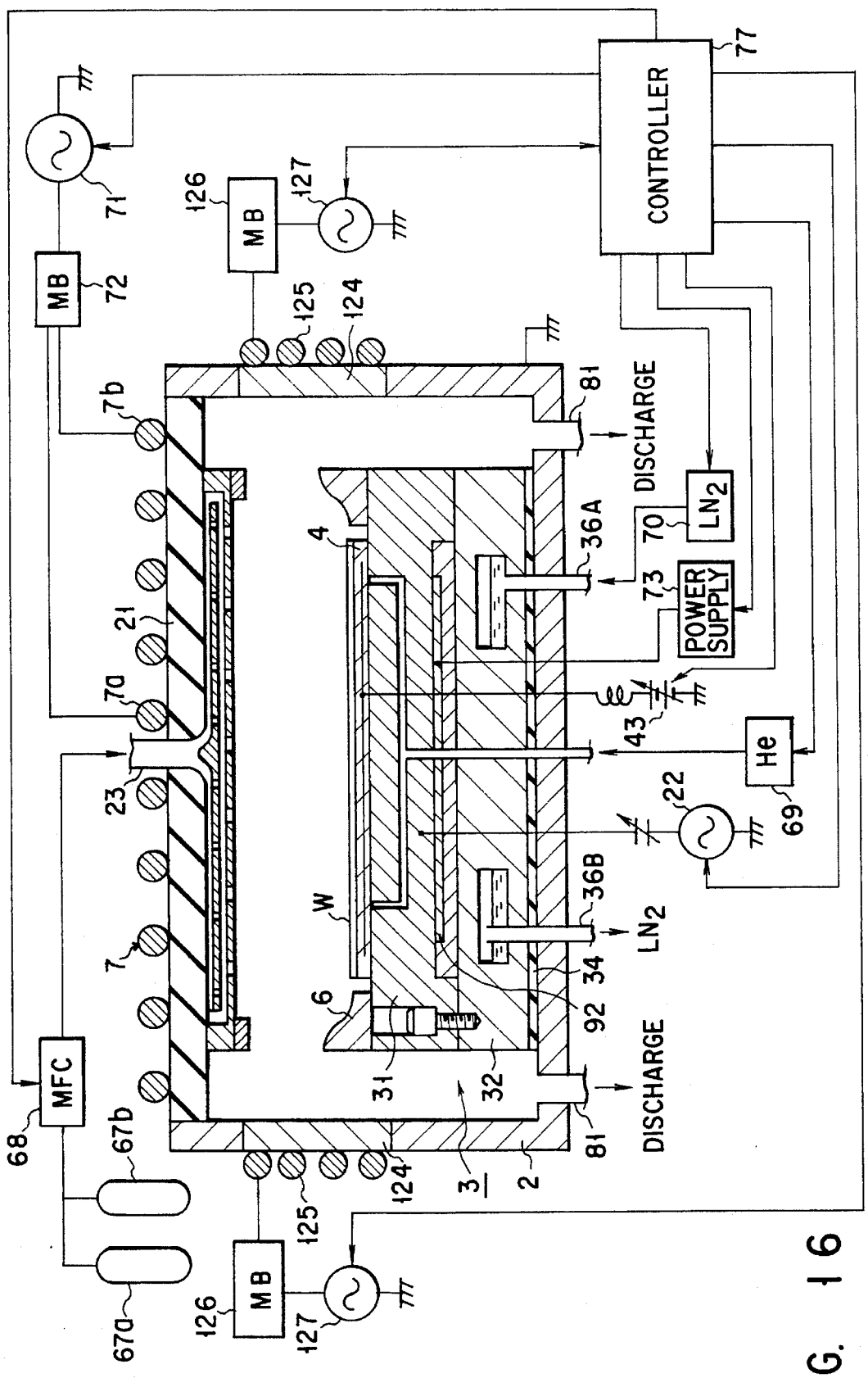
FIG. 16 is a view showing a modification of the apparatus shown in FIG. 10 to which another RF antenna is provided to the outer surface of the processing chamber.

In any of the plasma processing apparatuses of the above embodiments, RF induction is performed only by the RF antenna 7 which is arranged on the upper surface of the processing chamber 2 through an insulating member 21, e.g., quartz glass. However, the present invention is not limited to these embodiments, and can have, for example, a structure as shown in FIG. 16. In this apparatus, part of the side wall of a processing chamber 2 is constituted by an annular insulating member 124 or a plurality of insulating members 124 which are separated from each other at predetermined intervals in the circumferential direction. Quartz glass or ceramics can be used as the insulating member 21. A plurality of second RF antennas 125 are mounted on the outer surface(s) of the insulating member(s) 124. These second RF antennas 125 are preferably arranged radially at equal angular intervals with each other in the circumferential direction, and are respectively connected through matching circuits 126. An RF energy is applied to the second RF antennas 125 from an RF power supply 127 controlled by a controller 77. With this arrangement, a plasma can be excited also from the side wall portion of the processing chamber 2. Therefore, a high-density, uniform plasma can be generated in the processing chamber 2 to have a desired density distribution by adjusting the RF energy applied to the respective antennas. As a result, higher-precision plasma processing is enabled.

Figure 17:
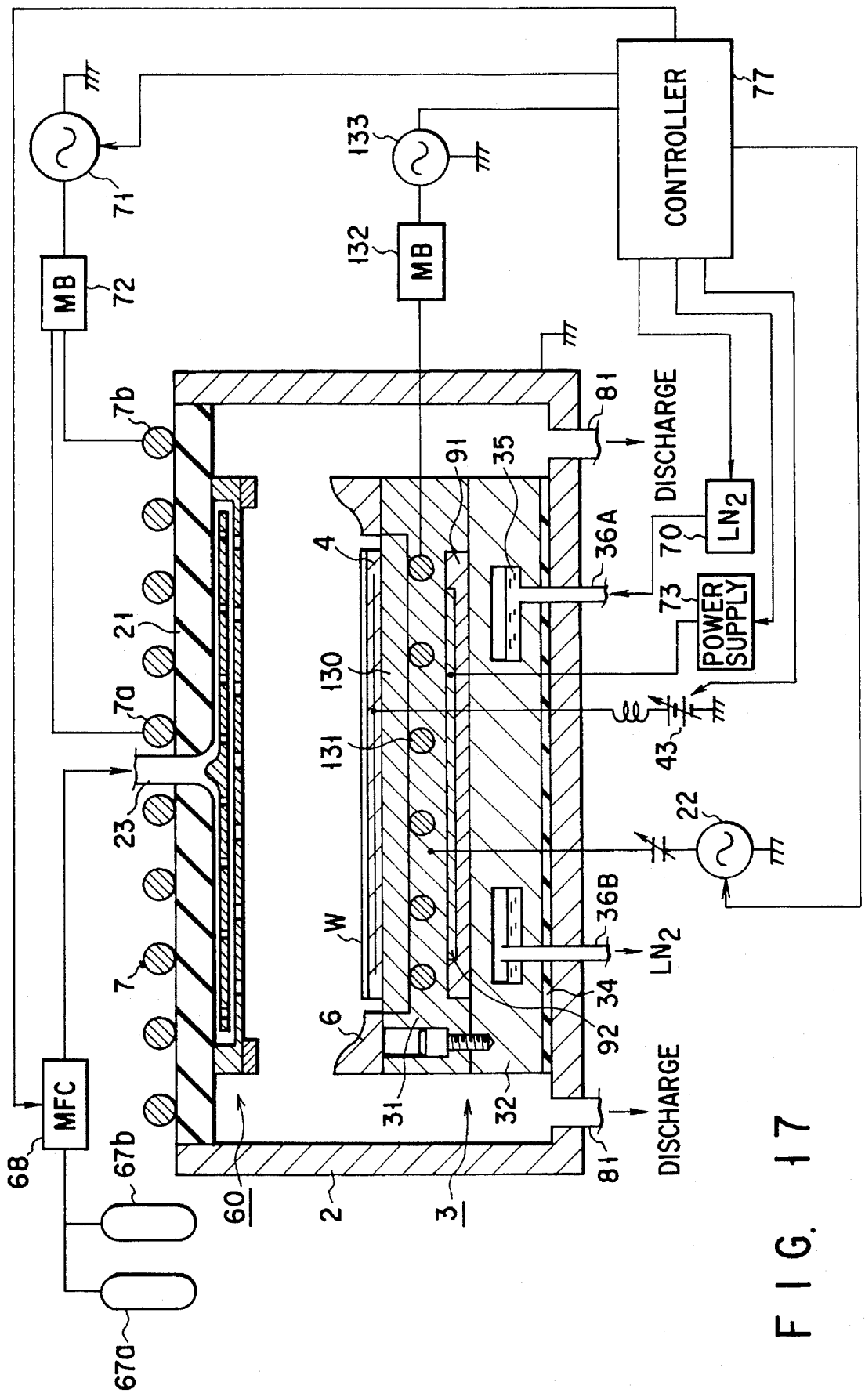
FIG. 17 is a view showing a modification of the apparatus shown in FIG. 10 to which another RF antenna is provided in the rest table.

In a plasma processing apparatus of an embodiment shown in FIG. 17, the upper portion of a rest table 3 is made of an insulating member 130, e.g., quartz glass, and a flat coil-type RF antenna 131 is arranged on the lower surface of the insulating member 130. An RF energy is applied to the RF antenna 131 by an RF power supply 133, connected through a matching circuit 132, under the control of a controller 77. With this arrangement, a plasma can be excited also from the lower surface of the rest table 3 of a processing chamber 2. Therefore, a high-density, uniform plasma can be generated in the processing chamber 2 to have a desired density distribution by adjusting the RF energy applied to the respective antennas. As a result, higher-precision plasma processing is enabled.

Figure 18:
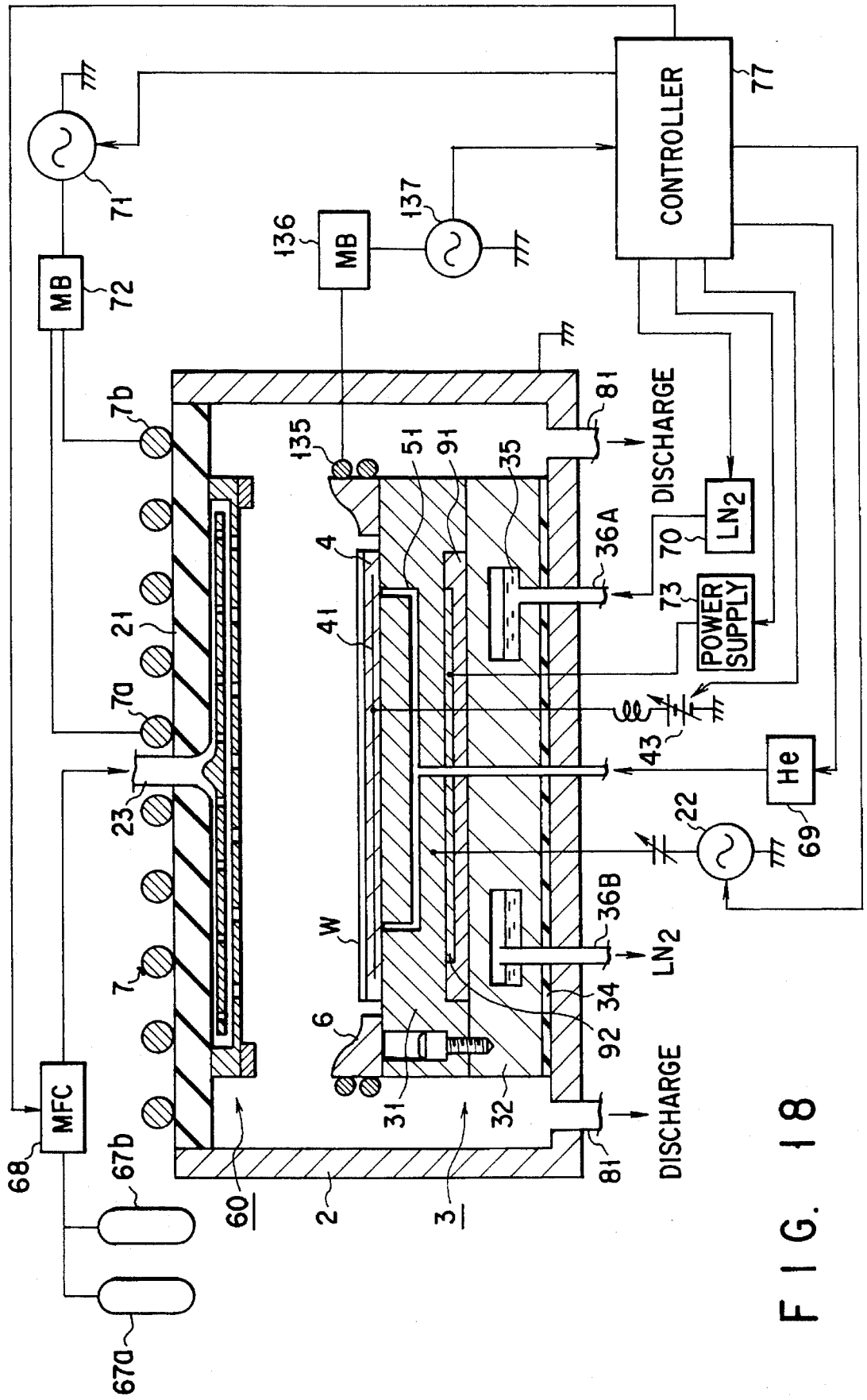
FIG. 18 is a view showing a modification of the apparatus shown in FIG. 10 to which another RF antenna is provided around the focus ring.

In an apparatus of an embodiment shown in FIG. 18, a focus ring 6 arranged around the upper surface of a rest table 3 is constituted by an insulating material, e.g., quartz glass or ceramics. An RF antenna 135 is arranged around the focus ring 6. An RF energy is applied to the RF antenna 135 by an RF power supply 137 which is connected through a matching circuit 136. With this arrangement, a plasma can be excited also from a portion around the rest table 3 of a processing chamber 2. Therefore, a high-density, uniform plasma can be generated in the processing chamber 2 to have a desired density distribution by adjusting the RF energy applied to the respective antennas. As a result, higher-precision plasma processing is enabled.

When an object to be processed, e.g., an LCD, which has a comparatively large area is to be processed with a plasma, as shown in FIG. 19, a plurality of (four in this embodiment) RF antennas 7 may be mounted on the outer wall portion of an insulating member 21 arranged on the upper surface of a processing chamber 2, and an RF energy may be applied to the respective RF antennas 7 by an RF power supply 71 connected through matching circuits 72. With this arrangement, even if the processing chamber 2 has a large size for processing an object to be processed which has a comparatively large area, a high-density, uniform RF plasma can be excited.

In the embodiments described above, a body or wafer W to be processed is placed on the upper surface of the rest table 3, and the plasma is excited by the RF antenna(s) 7 placed on the upper surface of the processing chamber 2. However, the present invention is not limited to this arrangement. For example, a face-down method as shown in FIG. 20 may be employed. In this apparatus, elements identical to the respective constituent elements of the processing apparatus shown in FIG. 10 are arranged almost upside down. In this face-down type apparatus, it is preferable to provide a vertically movable support mechanism 140 for supporting the body W to be processed from below and a vertically movable pusher pin mechanism 141 for removing the body W to be processed from an electrostatic chuck 4. When this arrangement is adopted, the surface to be processed of the body W to be processed can be protected from being contaminated by fine particles and the like. As a result, the yield and throughput can be further improved.

An arrangement as shown in FIG. 21 may also be adopted. According to this arrangement, a substantially cylindrical processing chamber 2 is vertically arranged. Two insulating disk plates 21 are arranged in the two openings of the processing chamber 2. RF antennas 7 are mounted on the outer wall surfaces of the respective insulating members 21. Two bodies W to be processed are chucked on the two surfaces of a rest table 3, arranged at the center of the processing chamber 2 substantially vertically, through electrostatic chucks 4. When this arrangement is adopted, two bodies W to be processed can be processed simultaneously. Since the surface of the body W to be processed is arranged vertically, the surface to be processed is protected from being contaminated by fine particles and the like, thereby further improving yield and throughput.

Figure 22:
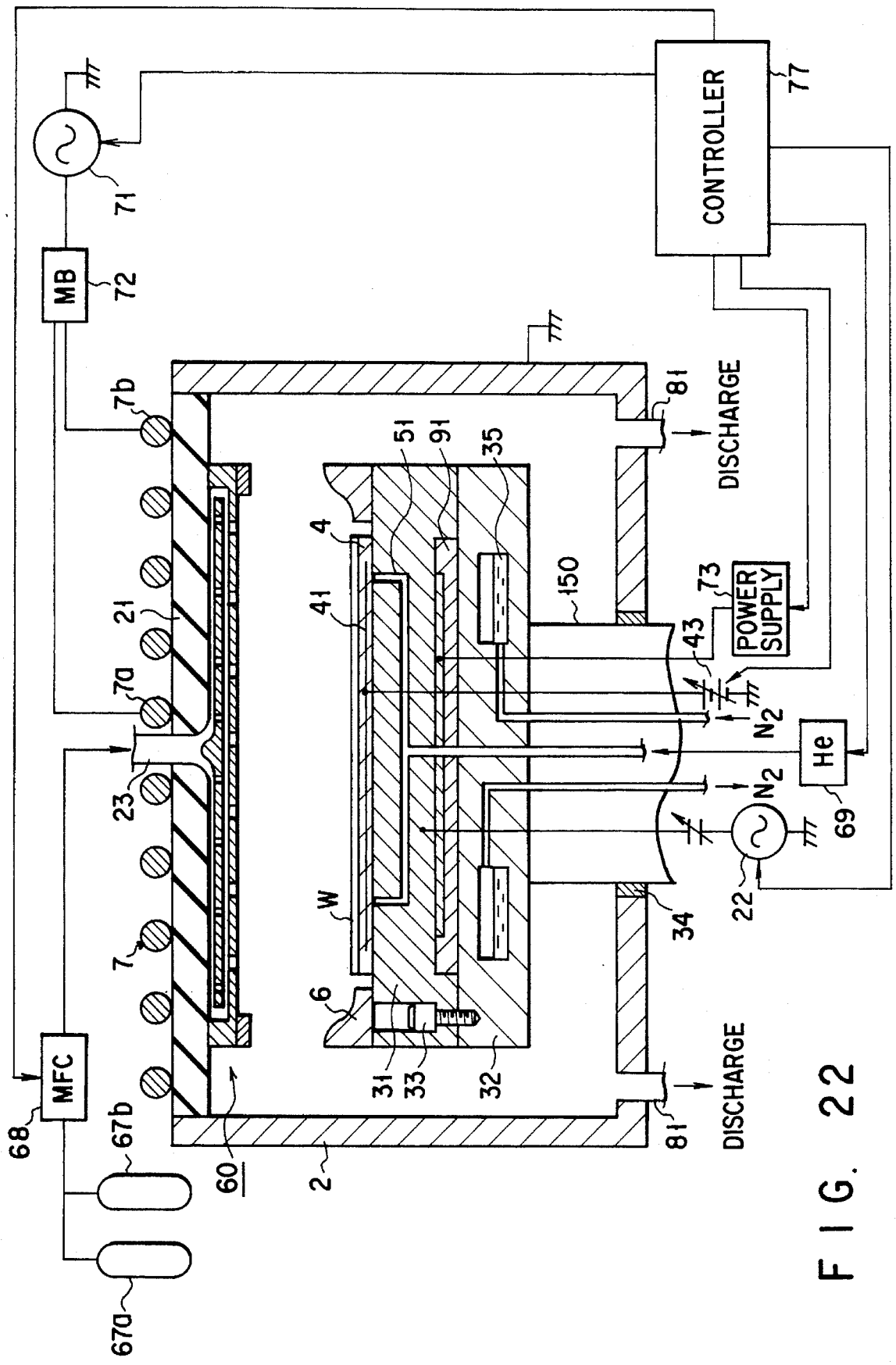
FIG. 22 is a sectional view showing a plasma processing apparatus in which a rest table is provided to be vertically movable.

FIG. 22 shows a plasma processing apparatus according to still another embodiment of the present invention. In this embodiment, a rest table 3 is not fixed on the wall surface of a processing chamber 2, but is placed on an elevating mechanism 150 which is vertically movable. Various types of pipes and electric circuits for supplying a cool or heat source and a heat transfer gas to the rest table 3 are arranged in the elevating mechanism 150. When this arrangement is adopted, the surface to be processed of a wafer W on the rest table 3 can be adjusted to be vertically moved with respect to an RF antenna 7 serving as a plasma generating source. Thus, the surface to be processed can be moved to a space having an optimum plasma density distribution and be processed.

Figure 23:
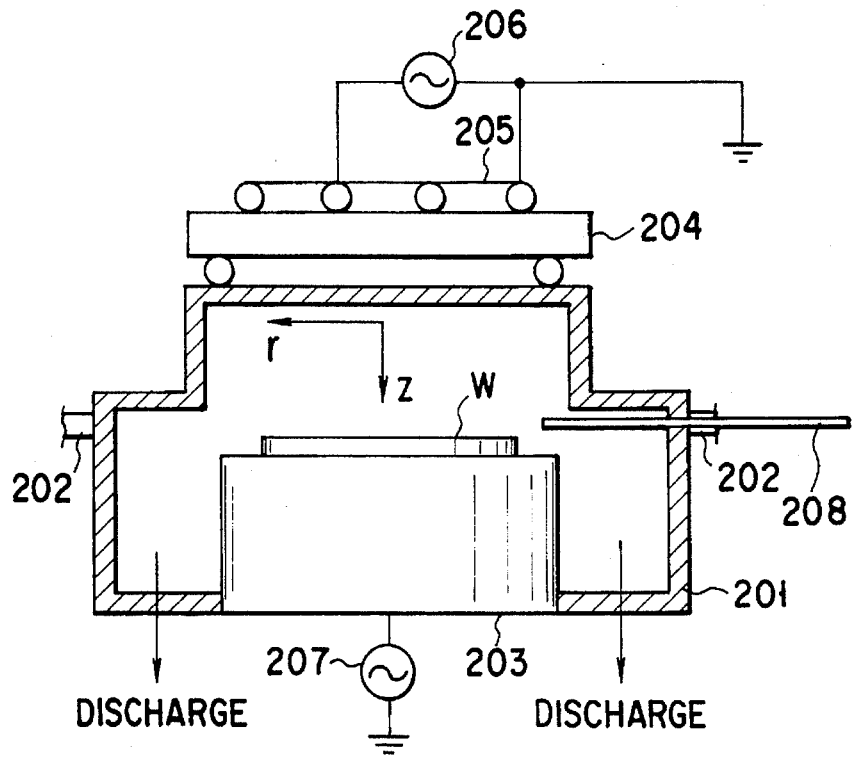
FIG. 23 is a view schematically showing an experiment equipment.

Various experiments conducted in order to confirm the characteristics of the plasma processing apparatus employing the RF induction method will be described. An equipment shown in FIG. 23 was used for the experiments. Referring to FIG. 23, reference numeral 201 denotes a chamber. A rest table or electrode 203 for placing a wafer W thereon is disposed in the chamber 201. Gas inlet ports 202 are formed in the side wall of the chamber 201. The chamber 201 is constituted by upper and lower cylindrical portions. The upper cylindrical portion has a smaller diameter than that of the lower cylindrical portion. Reference numeral 204 denotes a glass plate forming the upper wall of the chamber 201; and 205, an RF antenna made of a flat coil. Reference numerals 206 and 207 respectively denote RF power supplies respectively connected to the antenna 205 and the electrode 203. The upper and lower portions of the chamber 201 have diameters of 330 mm and 360 mm, respectively. The glass plate 204 has a thickness of 32 mm. The gap between the lower surface of the glass plate 204 and the upper surface of the wafer W is set to 20 mm.

In this equipment, assuming that a plasma having a density proportional to the intensity distribution of the induced electric field is generated by this equipment, the diffusion of the plasma was numerically calculated by adopting the following diffusion equation:

$$dN/dt - D\Delta N = Q(r, \theta, z) \quad (1)$$

where the internal flow rate is assumed to be 0, $N(r, \theta, z)$ is the plasma density, $Q(r, \theta, z)$ is the amount of the generated plasma, and $D(r, \theta, z)$ is the diffusion coefficient.

Figure 24:
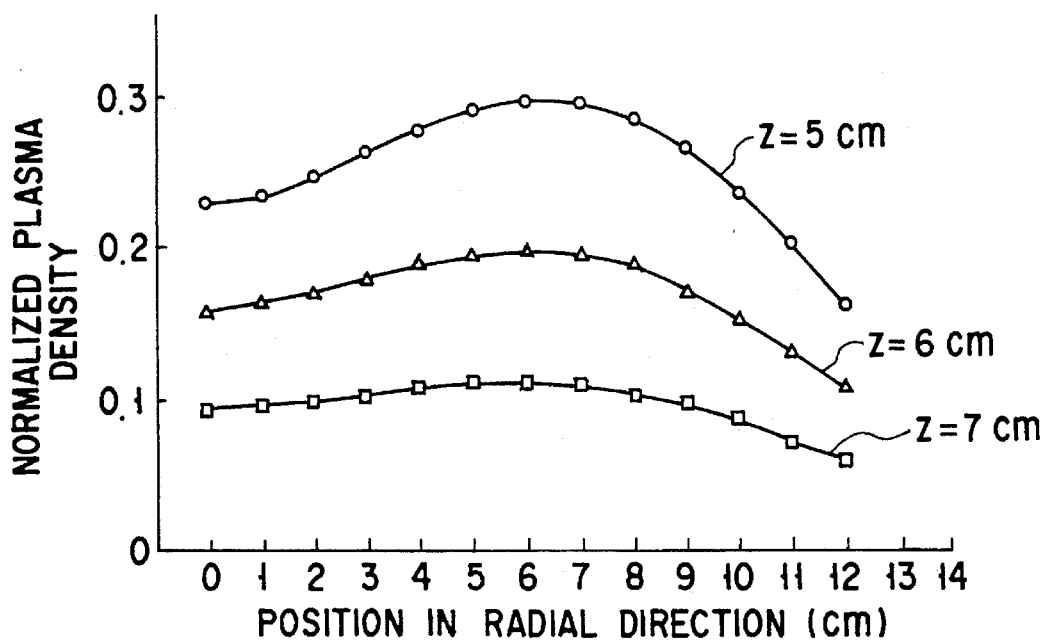
FIG. 24 is a graph showing plasma diffusion states obtained by calculation.

The results of this calculation are shown in FIG. 24. In FIG. 24, the ordinate represents the normalized plasma density in the vertical direction, and the abscissa represents the position in the radial direction of the wafer. Referring to FIG. 24, o indicates a diffusion state obtained when z=5 cm, and A and □ indicate diffusion states obtained when z=6 cm and z=7 cm, respectively, wherein z indicates the position from the upper surface of the chamber in the Z direction. From FIG. 24, it was confirmed that, when z=7 cm, the plasma was diffused uniformly substantially in the radial direction of the wafer, and that a plasma having an appropriate diffusion distance and a good uniformity can be expected.

Subsequently, the pressure dependencies of the electron density and electron temperature were measured by applying an RF voltage of 13.56 MHz to the antenna 205 and a voltage of 400 kHz to the rest table 203, and supplying Ar gas through one gas inlet port 202 at a flow rate of 30 sccm to 400 sccm. This measurement was performed by inserting a Langmuir probe 208 into the other gas inlet port 202.

The results of this measurement are shown in FIG. 25. In FIG. 25, the ordinates represent the electron density and the electron temperature, and the abscissa represents the pressure in the chamber. Referring to FIG. 25, o indicates the pressure dependency of the electron density, and Δ indicates the pressure dependency of the electron temperature. From FIG. 25, it was confirmed that the electron density increased with an increase in pressure, and that the electron temperature decreased in proportion to an increase in pressure.

The power dependencies of the electron density and electron temperature were measured by employing the same method. The obtained result is shown in FIG. 26. Referring to FIG. 26, o indicates the power dependency of the electron density, and Δ indicates the power dependency of the electron temperature. From FIG. 26, it was confirmed that the electron density increased in proportion to an increase in power, and that the electron temperature slightly decreased in proportion to an increase in power, but was almost constant.

Figure 27:
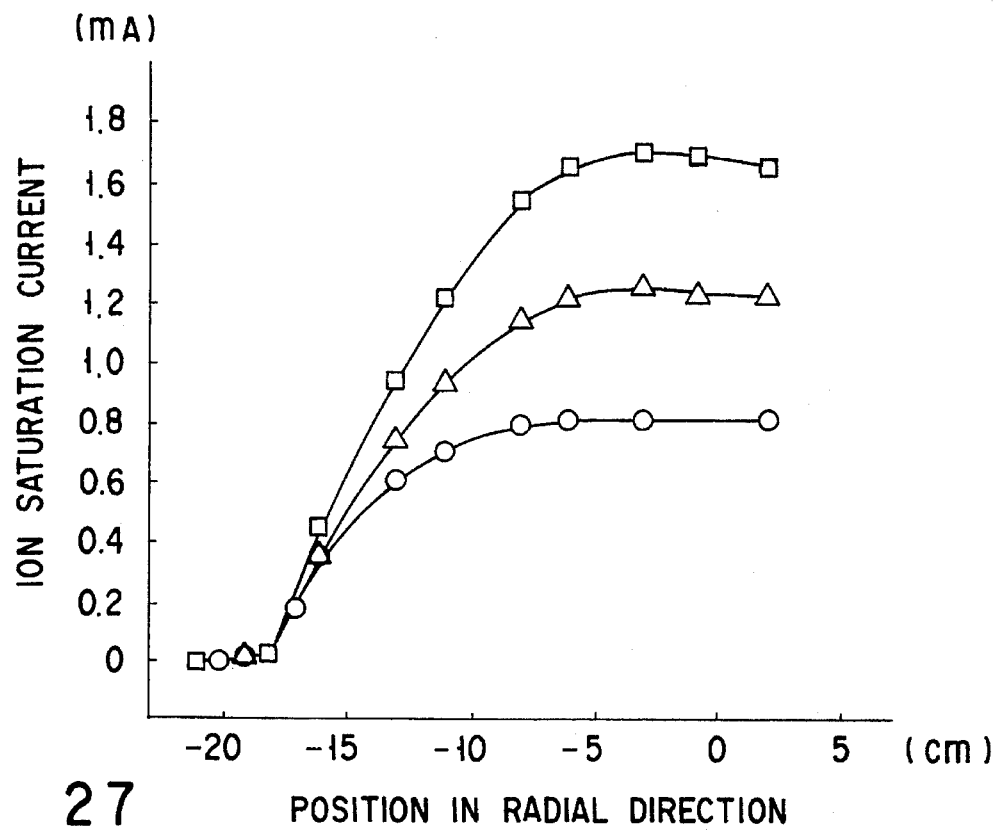
FIG. 27 is a graph showing the distributions of the ion saturation currents in the radial directions of wafers, which are obtained by experiments.

The distribution of the ion saturation current in the radial direction was measured by changing the pressure and the flow rate of the Ar gas. The obtained result is shown in FIG. 27. In FIG. 27, the ordinate represents the ion saturation current, and the abscissa represents the position in the radial direction of the wafer. Referring to FIG. 27, o indicates a case wherein the flow rate of the Ar gas is 30 sccm and the pressure is 3.5 mTorr, A indicates a case wherein the flow rate of the Ar gas is 100 sccm and the pressure is 10.5 mTorr, and □ indicates a case wherein the flow rate of the Ar gas is 180 sccm and the pressure is 18 mTorr. Note that the RF power was 1,000 W. The ion saturation current corresponds to the uniformity of CVD and etching. From FIG. 27, it was confirmed that the uniformity of the central region improved as the pressure decreased.

Light emitted from a plasma generated at a position 1 to 2 cm above the rest table 203 was condensed and spectroscopically measured through a window and a lens provided to the side wall of the chamber 201, thereby determining the pressure dependency of the emission spectrum of Ar in units of emission wavelengths.

Figure 28:
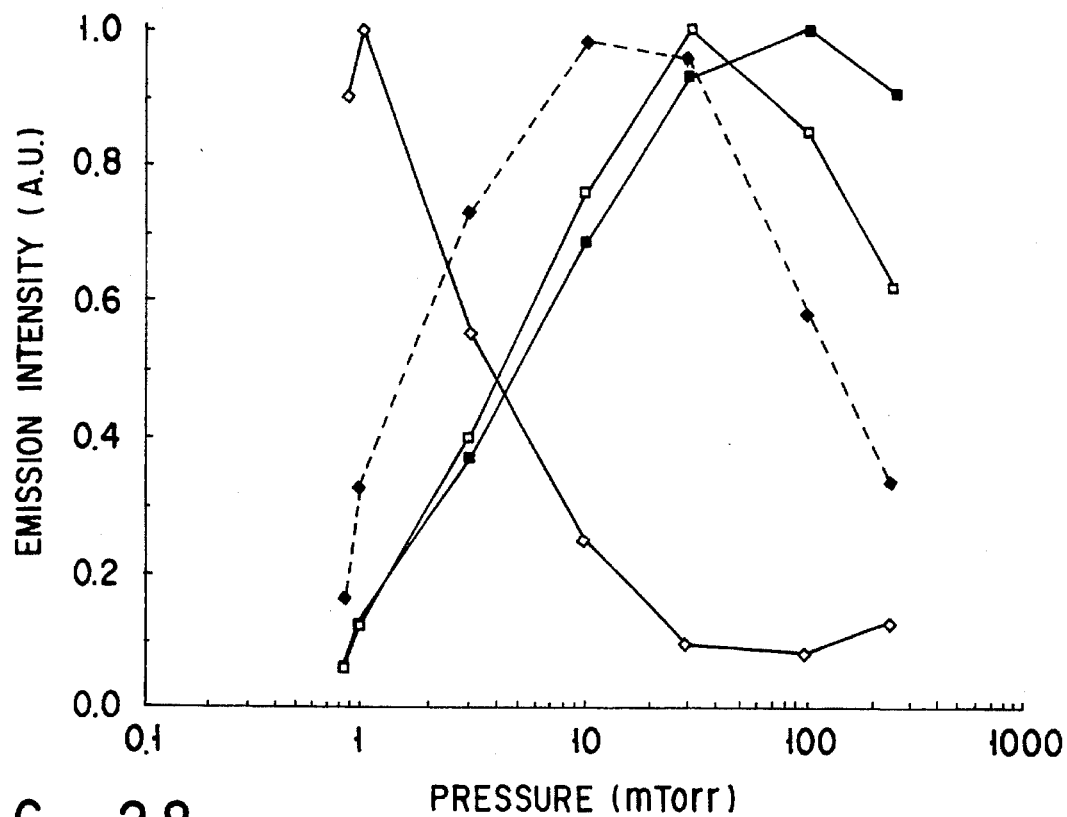
FIG. 28 is a graph showing the pressure dependency of the emission spectrum of argon, which is obtained by experiments.

The obtained results, which are normalized by the respective maximum intensities in units of emission wavelengths, are shown in FIG. 28. In FIG. 28, the ordinate represents the emission intensity, and the abscissa represents the pressure in the chamber. Referring to FIG. 28, B indicates emission of Ar radicals at wavelengths of 810 nm and 811 nm, □ indicates emission of Ar radicals at a wavelength of 727 to 751 nm, ■ indicates emission of Ar radicals at a wavelength of 394 to 430 nm, and ◇ indicates emission of Ar ions at wavelengths of 460 nm and 465 nm.

From these results, it was confirmed that emission from the Ar radicals was much stronger than that from Ar ions. The emission intensity of Ar radicals had a peak at a pressure of 10 mTorr, and decreased as the pressure was decreased from 10 mTorr. Meanwhile, the emission intensity of Ar ions increased as the pressure was decreased, and had a peak at a pressure of about 1 mTorr. From these results, it is estimated that, since Ar radicals having a large wavelength are generated when the pressure is increased, the electron temperature might be decreased, i.e., the lower the pressure, the higher the electron temperature. The correctness of this estimation was confirmed by FIG. 24.

$CHF_3$ gas was supplied into the chamber 201, and the pressure dependency of the emission intensity was measured in units of the types of emission. The obtained results are shown in FIG. 29. In FIG. 29, the ordinate represents the emission intensity, and the abscissa represents the pressure in the chamber 201. Referring to FIG. 29, ◇ indicates C (carbon); x, H (hydrogen); □, F (fluorine); o, CF; and △, $CF_2$, respectively. CF and $CF_2$ are reaction products.

From FIG. 29, it was confirmed that, as the pressure was decreased, the emission intensity of $CF_2$ radicals decreased monotonically, while the emission intensity of CF had a peak at a pressure of about 11 mTorr. It was also confirmed that, as the pressure was decreased, the emission intensities of C, H, and F radicals largely increased.

A modification of a discharge system which does not use a plurality of discharge pipes 81, unlike in the above embodiments, will be described with reference to FIG. 30.

An annular hollow case body 87 is provided in a space between the outer circumferential surface of a rest table 3 and the inner circumferential surface of a chamber 2 to define a buffer chamber therein. The upper end of one discharge pipe (not shown) extending through the bottom wall of the processing chamber 2 is connected to the lower surface of the case body 87 so as to communicate with the buffer chamber. A plurality of discharge holes 89 are formed in the upper wall of the case body 87 at predetermined intervals from each other in the circumferential direction, in order to communicate the buffer chamber and the interior of the chamber 2 with each other. Each discharge hole 89 is provided with a mechanical shutter 88 that can open and close it. These mechanical shutters 88 are connected to a control mechanism (not shown) so that they can externally and arbitrarily adjust the opening degree of the discharge holes 89 with a known method. As a result, the gas in the chamber can be discharged at an arbitrary flow rate by adjusting the opening degree of the discharge holes 89.

In place of the annular case body 87, an annular plate having a large number of discharge holes formed therein may be provided to extend horizontally between the outer circumferential surface of the rest table 3 and the inner circumferential surface of the chamber 2, and the buffer chamber may be defined by this annular plate, the outer circumferential surface of the rest table 3, and the inner circumferential surface and the bottom surface of the chamber 2.

Figure 31A:
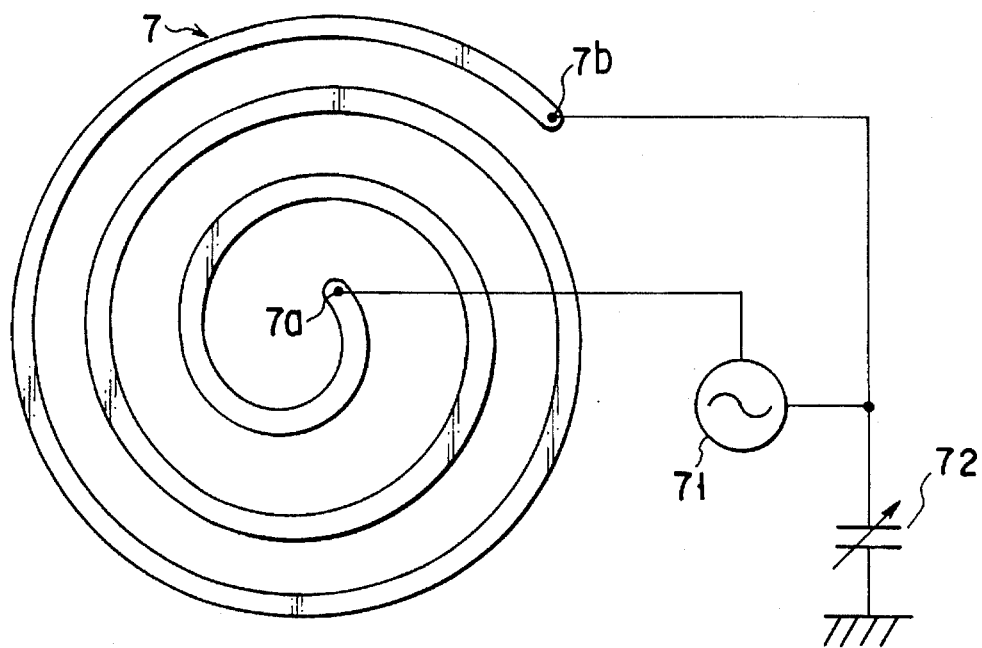
FIG. 31A is a view showing the wiring of a spiral coil used in the embodiments.
Figure 31B:
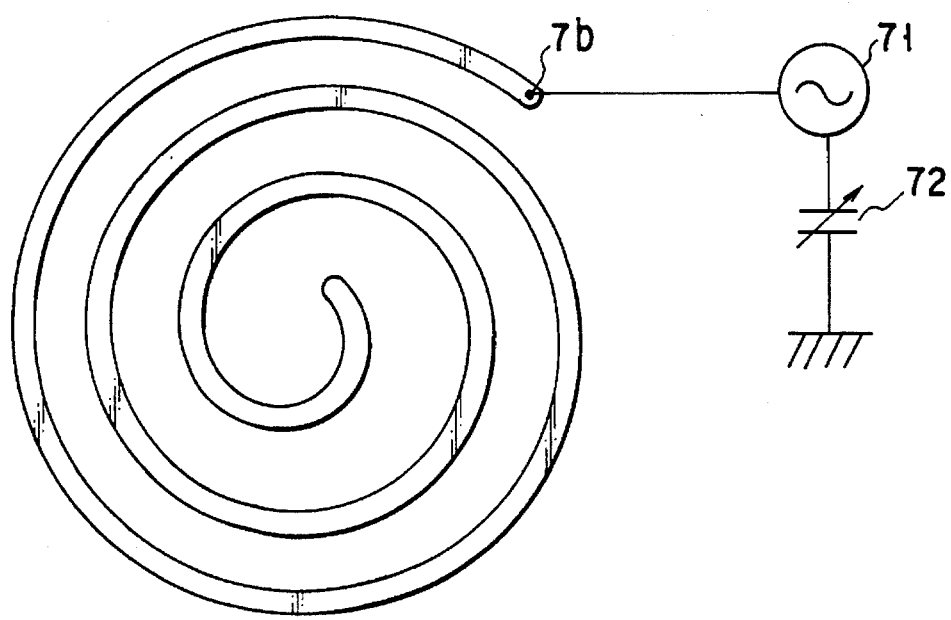
FIG. 31B is a view showing a modification of the wiring of the spiral coil.

In any of the processing apparatuses of the above embodiments, an RF power supply 71 and a matching circuit 72 are connected between an inner end 7a and an outer end 7b of the spiral coil antenna 7, as shown in FIG. 31A. However, the present invention is not limited to this wiring. For example, as shown in FIG. 31B, an RF power supply 71 and a matching circuit 72 can be connected to only an outer end 7b of the spiral coil. With this wiring, even if the interior of the processing chamber is set at a lower-pressure atmosphere, a good RF induction plasma can be generated.

Plasma processing has been described above with reference to etching. However, the present invention can similarly be applied to other plasma processing apparatuses, e.g., a plasma CVD apparatus, a plasma ashing apparatus, a plasma sputtering apparatus, and the like. Note that the RF antenna can be provided in the chamber by subjecting its surface to an anti-corrosion treatment. The object to be processed is not limited to a semiconductor wafer but can be an LCD substrate.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma processing apparatus comprising:

a chamber having a gas inlet port and a gas discharge port;

supporting means, disposed in said chamber, for supporting an object to be processed which has a surface to be processed;

a flat coil provided to oppose the surface to be processed of the object which is supported by said supporting means, with a gap therebetween;

RF power supply means for supplying an RF current to said coil, thereby generating a plasma in said chamber between said coil and said supporting means; and directing means, provided to said supporting means to surround the object to be processed, and having a projecting portion projecting toward said coil past the surface to be processed of the object to be processed, and including an electrical insulator or a high resistance, for focussing the plasma in a direction substantially parallel to the surface of the object to be processed;

wherein said directing means has an outer annular member consisting of an electrical insulator or a high ohmic resistance, and an inner annular member arranged between said outer annular member and the object to be processed and consisting of a conductor.

2. An apparatus according to claim 1, wherein said outer annular member projects more toward said coil than said inner annular member.

3. An apparatus according to claim 1, further comprising:

temperature adjusting means for adjusting a temperature of said supporting means;

gas supply means for supplying a heat transfer gas, that transfers heat of said temperature adjusting means to the object to be processed, to a portion between said supporting means and the object to be processed;

pressure detecting means for detecting a pressure of the supplied gas and generating a signal corresponding to the pressure; and control means for adjusting a gas supply amount of said gas supply means based on the signal from said pressure detecting means, thereby controlling heat transfer of the gas to the object to be processed.

4. An apparatus according to claim 3, wherein said control means controls the gas supply amount such that the temperature of the object to be processed is constant during processing.

5. An apparatus according to claim 3, further comprising temperature detecting means for detecting the temperature of said supporting means and generating a signal corresponding to the detected temperature, wherein said control means adjusts the gas supply amount of said gas supply means based on the signals from said temperature detecting means and said pressure detecting means.

6. An apparatus according to claim 1, wherein said supporting means comprises an electrostatic chuck for supporting the object to be processed by electrostatic chucking said electrostatic chuck having an outer layer consisting of a material having a high resistance against a reactive ion and an electrode provided in said outer layer.

7. An apparatus according to claim 6, wherein said outer layer of said electrostatic chuck consists of one member selected from the group consisting of a ceramic, quartz, and an insulating polymer.

8. An apparatus according to claim 1, wherein said supporting means has a housing counter electrode, and an RF bias energy having a frequency of 1 to 3 MHz is applied to said electrode.

9. An apparatus according to claim 1, comprising means for cooling said supporting means to −50° to −150° C. during processing of the object to be processed.

10. An apparatus according to claim 1, comprising means for supplying a gas mixture containing $CH_4$ gas, $CF_4$ gas, and $O_2$ gas in an amount of not more than 10% or Ar gas in an amount of not more than 50% in the ratio of flow rates, or a gas mixture containing $NF_3$ gas, $CH_4$ gas, and $O_2$ or Ar gas to said chamber through said gas inlet port, thereby etching the object to be processed.

11. An apparatus according to claim 10, comprising means for heating an inner surface of said chamber to 50° to 100° C. during etching.

12. A plasma processing apparatus comprising:

a chamber having a gas inlet port and a gas discharge port;

supporting means, disposed in said chamber, for supporting an object to be processed which has a surface to be processed;

a flat coil provided to oppose the surface to be processed of the object which is supported by said supporting means, with a gap therebetween;

RF power supply means for supplying an RF current to said coil, thereby generating a plasma in said chamber between said coil and said supporting means; and directing means, provided to said supporting means to surround the object to be processed, and having a projecting portion projecting toward said coil past the surface to be processed of the object to be processed for focussing the plasma in a direction substantially parallel to the surface of the object to be processed;

wherein said directing means has an annular plasma focus ring consisting of an electrical insulator or a high ohmic resistance;

wherein said focus ring has a projecting surface which forms a step farther from said coil as it is closer to the object to be processed.

13. An apparatus according to claim 12, wherein the step of said projecting surface of said focus ring has a lower surface and an upper surface extending from said lower surface toward said coil at an angle of about 90 degrees with respect to said lower surface.

14. A plasma processing apparatus comprising:

a chamber having a gas inlet port and a gas discharge port;

supporting means, disposed in said chamber, for supporting an object to be processed which has a surface to be processed;

a flat coil provided to oppose the surface to be processed of the object which is supported by said supporting means, with a gap therebetween;

RF power supply means for supplying an RF current to said coil, thereby generating a plasma in said chamber between said coil and said supporting means; and directing means, provided to said supporting means to surround the object to be processed, and having a protecting portion projecting toward said coil past the surface to be processed of the object to be processed for focussing the plasma in a direction substantially parallel to the surface of the object to be processed;

wherein said directing means has an annular plasma focus ring consisting of an electrical insulator or a high ohmic resistance;

wherein said focus ring has a projecting surface which forms a curved contour;

wherein said curved contour of said projecting surface of said focus ring has a lower surface which is farther away from said coil as it is closer to the object to be processed, and an upper surface extending from said lower surface toward said coil.

15. A plasma processing apparatus comprising:

a chamber having a gas inlet port and a gas discharge port;

supporting means, disposed in said chamber, for supporting an object to be processed which has a surface to be processed;

an electrode provided to oppose the surface to be processed of the object which is supported by said supporting means, with a gap therebetween;

RF power supply means for supplying an RF current to said electrode, thereby generating a plasma in said chamber between said electrode and said supporting means; and directing means, provided to said supporting means to surround the object to be processed, and having a projecting portion projecting toward said electrode past the surface to be processed of the object to be processed for focussing the plasma in a direction substantially parallel to the surface of the object to be processed;

wherein said directing means has an outer annular member consisting of an electrical insulator or a high ohmic resistance, and an inner annular member arranged between said outer annular member and the object to be processed and consisting of a conductor.

* * * * *